(12) United States Patent
Nelson et al.

(10) Patent No.: US 10,563,739 B2
(45) Date of Patent: Feb. 18, 2020

(54) BI-TRIAXIAL PHOTOCONDUCTIVE SWITCH MODULE

(71) Applicant: Lawrence Livermore National Security, LLC, Livermore, CA (US)

(72) Inventors: Scott D. Nelson, Patterson, CA (US); Steve Hawkins, Livermore, CA (US); Brian R. Poole, Tracy, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 996 days.

(21) Appl. No.: 15/069,866

(22) Filed: Mar. 14, 2016

(65) Prior Publication Data
US 2019/0280689 A1    Sep. 12, 2019

(51) Int. Cl.
H03K 3/57    (2006.01)
F16H 15/38   (2006.01)
H03K 17/78   (2006.01)

(52) U.S. Cl.
CPC ............. F16H 15/38 (2013.01); H03K 17/78 (2013.01); *F16H 2015/383* (2013.01); *H03K 3/57* (2013.01)

(58) Field of Classification Search
CPC .................................. H03K 17/78; H03K 3/57
See application file for complete search history.

(56) References Cited

U.S. PATENT DOCUMENTS

| 3,308,308 A | 3/1967 | Bray |
| 4,376,920 A | 3/1983 | Smith |
| 5,382,788 A * | 1/1995 | Kim ........................ H01L 31/08 250/214.1 |
| 6,943,319 B2 | 9/2005 | Jones |
| 7,897,490 B2 | 3/2011 | Preble et al. |
| 8,125,089 B2 | 2/2012 | Caporaso et al. |
| 8,258,632 B1 | 9/2012 | Sullivan et al. |
| 8,299,554 B2 | 10/2012 | Adkisson et al. |
| 2013/0328058 A1 | 12/2013 | Nelson |
| 2013/0328146 A1 | 12/2013 | Nelson |
| 2013/0342306 A1 | 12/2013 | Sampayan |
| 2014/0363123 A1 | 12/2014 | Caporaso |

(Continued)

FOREIGN PATENT DOCUMENTS

| EP | 1 552 536 B1 | 6/2010 |
| WO | 2012/162702 A2 | 11/2012 |

OTHER PUBLICATIONS

Belser, R.B., "Electrical Resistances of Thin Metal Films before and after Artificial Aging by Heating," Journal of Applied Physics, 28(1):109-116, Jan. 1957.

(Continued)

*Primary Examiner* — Thanh Luu
(74) *Attorney, Agent, or Firm* — Perkins Coie LLP

(57) ABSTRACT

Methods, systems, and devices describe bi-triaxial photoconductive switch modules that that eliminate the need for external DC blocking capacitors, while providing a highly compact structure that can produce bipolar output waveforms conducive to feeding to radio-frequency (RF) devices, such as antennas. Some implementations of the disclosed bi-triaxial photoconductive switch modules utilize unified cast-in-place capacitors that can be designed with an appropriate geometry, volume and orientation to provide desired energy storage capacity while eliminating or reducing parasitics.

28 Claims, 20 Drawing Sheets

(56) References Cited

U.S. PATENT DOCUMENTS

2017/0264291 A1  9/2017  Nelson et al.
2018/0013028 A1  1/2018  Nelson et al.

OTHER PUBLICATIONS

Sali, S., et al., "Triaxial cable designs with optimum braided shields," IEE Proceedings A (Physical Science, Measurement and Instrumentation, Management and Education), 137(4):165-174, Jul. 1990.

Sullivan, J.S., "Wide Bandgap Extrinsic Photoconductive Switches," ProQuest Dissertations and Theses, Ph.D. Thesis University of California, Davis, 2013, vol. 75-03(E), Sec. B, 375 pages, Jul. 2013.

* cited by examiner

BI-TRIAXIAL PHOTOCONDUCTIVE SWITCH MODULE

STATEMENT REGARDING FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

This patent document relates to systems, devices, and processes that use photoconductive switch technologies.

BACKGROUND

A photoconductive switch is an electrical switch that is controlled by an optical input (e.g., light) to cause photo-induced conductivity of the switch material. For example, light applied to the switch material can increase its electrical conductance as a consequence of irradiation with light. Photoconductive switches can be used for photoconductive sampling, generation of high frequency pulses (e.g., terahertz pulses), high-speed photodetectors in optical fiber communications, and in analog-to-digital converters, among other applications. Existing photoconductive switch modules can be designed using various package geometries. However, the energy storage systems in the switch module that feed such photoconductive switches include considerable parasitic capacitive and inductive effects due to the geometry of the structure containing the energy storage.

SUMMARY

The disclosed techniques, systems, and devices relate to bi-triaxial photoconductive switch modules that eliminate the need for external DC blocking capacitors, while, at the same time, provide a highly compact structure that can produce bipolar output waveforms conducive to feeding to radio-frequency (RF) output antenna in a compact geometry that are also amenable to antenna array configurations.

One aspect of the disclosed technology relates to a bi-triaxial photoconductive switch module that includes an outer conductor, a center electrode, and a first capacitor formed between a first section of the outer conductor and a first plate that is positioned within a cavity formed by the outer conductor. The bi-triaxial photoconductive switch module further includes a second capacitor formed between a second section of the outer conductor and a second plate that is positioned within the cavity formed by the outer conductor, a first photoconductive switch positioned between the first plate and the center electrode such that, upon activation of the first photoconductive switch, an electrical connection between the first plate and the center electrode is formed, and a second photoconductive switch positioned between the second plate and the center electrode such that, upon activation of the second photoconductive switch, an electrical connection between the second plate and the center electrode is formed. The bi-triaxial photoconductive switch module also includes an output conductor coupled to the center electrode to deliver an output of the bi-triaxial photoconductive switch module.

In some embodiments, the bi-triaxial photoconductive switch module includes one or more light sources coupled to the first and the second photoconductive switches to enable activation of the first and the photoconductive switches. In one exemplary embodiment, the bi-triaxial photoconductive switch module includes an optical delay element configured to introduce a timing delay into one or both of: a first light path from the one or more light sources to the first photoconductive switch, or a second light path from the one or more light sources to the second photoconductive switch. In one exemplary embodiment, the one or more light sources are configured to deliver light to the first photoconductive switch that is out of phase with respect to light delivered to the second photoconductive switch. In another exemplary embodiment, the bi-triaxial photoconductive switch module includes an optical fiber that enables delivery of light to one or both of the first or the second photoconductive switches.

According to another exemplary embodiment, each of the first and the second plates has an elongated rectangular shape, the first plate has a first length, a first width and a first thickness, and the second plate has a second length, a second width and a second thickness. In one exemplary embodiment, the first length associated with the first plate is substantially equal to the second length associated with the second plate, the first width is substantially equal to the second width and the first thickness is substantially equal to the second thickness. In another exemplary embodiment, both the first plate and the second plate are positioned in a parallel configuration with respect to a longitudinal axis of the bi-triaxial photoconductive switch module such that a rectangular area of the first plate having the first length and the first width faces a rectangular area of the second plate having the second length and the second width. In yet another exemplary embodiment, one or both of the first plate or the second plate are positioned at an angled configuration with respect to a longitudinal axis of the bi-triaxial photoconductive switch module such that a rectangular area, or a portion thereof, of the first plate does not face a rectangular area, or a portion thereof, of the second plate. For example, the angled configuration can form an angle that is substantially equal to 90 degrees. In such an exemplary embodiment, the outer conductor can have an elliptical cross-sectional area.

In yet another exemplary embodiment, the bi-triaxial photoconductive switch module further includes one or more power supplies coupled to the first and the second capacitors to supply the first and the second capacitors with voltages having opposite polarities.

In one exemplary embodiment, the output conductor can be a coaxial cable. In this embodiment, the bi-triaxial photoconductive switch module includes a tapered section having a cone-shaped surface that couples the outer conductor to a conductor of the coaxial cable, where a diameter of a cylindrical enclosure formed by the outer conductor is larger than a diameter of the conductor of the coaxial cable.

According to yet another exemplary embodiment, the first capacitor includes a first dielectric material that is placed between at least a section of the first plate and a curved surface of the first section of the outer conductor, and the second capacitor includes a second dielectric material that is placed between at least a section of the second plate and a curved surface of the second section of the outer conductor. The first dielectric material and the second dielectric material can be the same type of material, having the same dielectric constant. In one exemplary embodiment, one or both of the first capacitor or the second capacitor is a cast-in-place capacitor. In another exemplary embodiment, each of the first and the second capacitor comprises a dielectric material that it formed by pouring or injecting the dielectric material in liquid form into a space between the first section of the outer conductor and the first plate and into a space between the second section of the outer conductor and the second plate, and allowing the liquid to settle into a solid form.

In one exemplary embodiment, the center electrode of the bi-triaxial photoconductive switch module includes a double center-bored electrode that is positioned between the first photoconductive switch and the second photoconductive switch. In another exemplary embodiment, the center electrode of the bi-triaxial photoconductive switch module includes a first hollow electrode, a second hollow electrode, and a double center-bored electrode, where the first hollow electrode is positioned between the first plate and the first photoconductive switch, the second hollow electrode is positioned between the second plate and the second photoconductive switch, and the double center-bored electrode is positioned between the first photoconductive switch and the second photoconductive switch.

In another exemplary embodiment, the first capacitor or the second capacitor comprises a discrete capacitor. In such an exemplary embodiment, the outer conductor has a rectangular cross-sectional area.

In yet another exemplary embodiment, the above noted bi-triaxial photoconductive switch module's outer conductor has a circular cross-sectional area.

DETAILED DESCRIPTION

In this patent document, the word "exemplary" is used to mean serving as an example, instance, or illustration. Any embodiment or design described herein as "exemplary" is not necessarily to be construed as preferred or advantageous over other embodiments or designs. Rather, use of the word exemplary is intended to present concepts in a concrete manner.

High voltage and high current switches have broad applicability, e.g., in the charged particle accelerator community. The ability to modulate high voltage and high current can be an enabling technique for pulsed systems, e.g., such as radar systems, communication systems, arbitrary-waveform generated high power RF sources, amplifier systems and many other applications.

Previous photoconductive switch systems have been plagued by capacitive parasitics, which degrade the waveform of the charge pulse and decrease the amplitude of the output RF waveform. Such systems also produce asymmetric waveforms, require output coupling capacitors, are space inefficient, and generate poor pulse fidelity.

Disclosed are devices, systems, and methods that relate to bi-triaxial photoconductive switch modules. The disclosed bi-triaxial photoconductive switch modules utilize two or more triaxial photoconductive switches modules coupled together to form a compact design and enable operation in a push-pull configuration. The bipolar RF output waveforms produced by the disclosed bi-triaxial photoconductive switch modules can be used in different applications, such as for driving antenna devices. In some implementations, the bi-triaxial systems described herein benefit from low inductance of a cast-in-place capacitor that is situated inside the body of the compact bi-triaxial module that is coupled to a coaxial output structure. Likewise, the output impedance of the module is easily settable by adjusting the inner and outer coaxial dimensions. The energy storage capacitor of the bi-triaxial module is separately settable by changing the shape and dimensions of the cast-in-place capacitor, as well as by the selecting the appropriate dielectric material.

Figure 1:
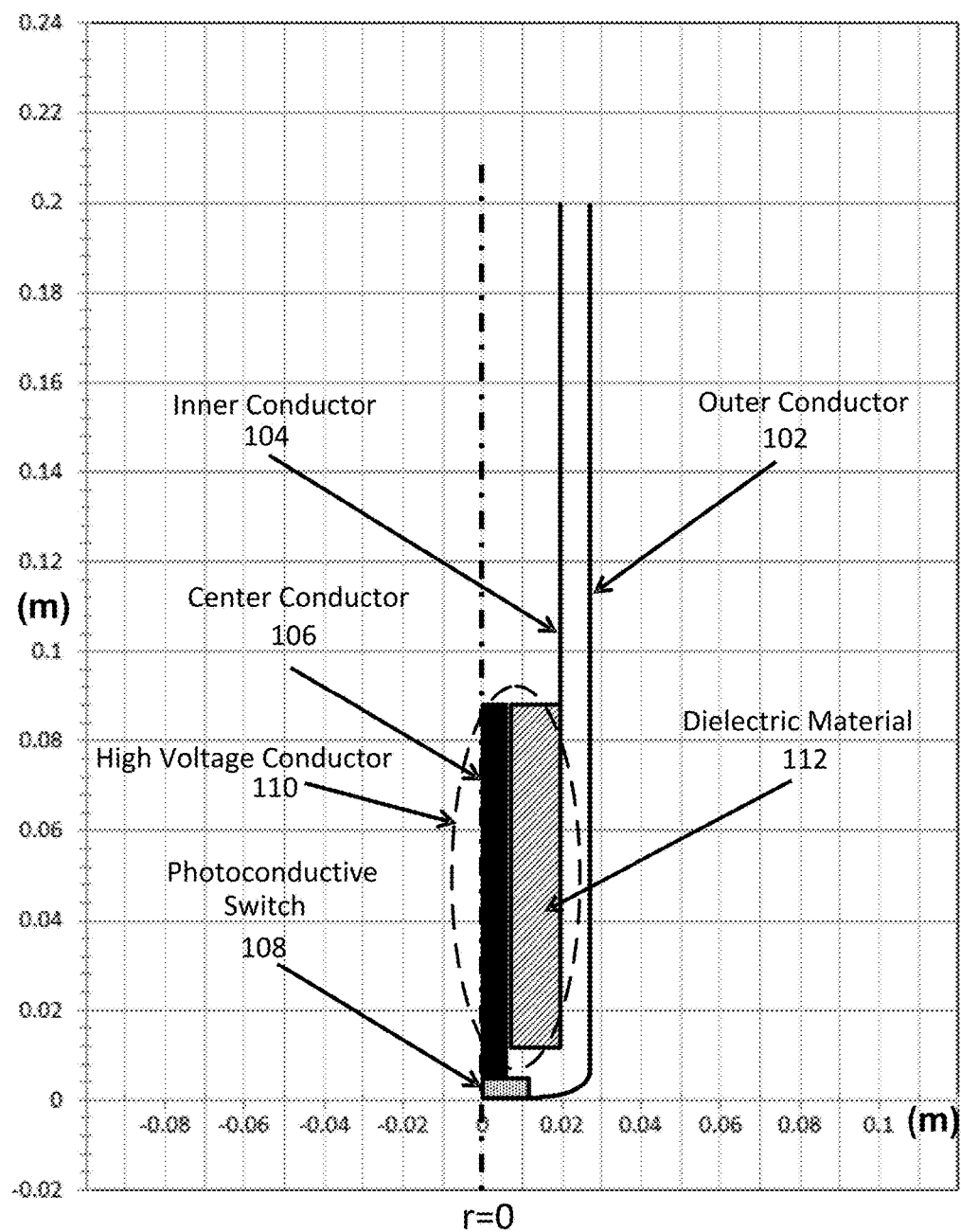
FIG. 1 illustrates an axially symmetric cross-sectional view of a triaxial photoconductive switch module.

FIG. 1 illustrates a cross-sectional view of a triaxial photoconductive switch module that is disclosed in a co-pending application titled "Triaxial photoconductive switch module." The triaxial photoconductive switch module includes an outer conductor 102, an inner conductor 104 and a center conductor 106. A solid-state photoconductive switch 108 is arranged at one end of the module between an end portion of the center conductor 106 and the outer conductor 102. A high voltage capacitor 110 (identified using the dashed oval) is produced by placing a dielectric material 112 between the center conductor 106 and the inner conductor 104. The high voltage capacitor 110 in FIG. 1 forms a cast-in-place capacitor. Incident light (not shown) on the photoconductive switch 108 activates (turns on) the photoconductive switch 108, resulting in a current flow through the module. The structure shown in FIG. 1 is axially symmetric with respect to the axis r that passes through the center of the center conductor 106.

High voltage energy storage is provided by the high voltage capacitor 110, which allows for a low inductance current path. The photoconductive switch 108 controls the flow of current between the center conductor 106 and the inner conductor 104 and the outer conductor 102. In operation, the charging phase occurs between the center conductor 106 and the inner conductor 104 when the high voltage charging system charges the high voltage capacitor 110. Upon activation of the photoconductive switch 108, the coaxial output is formed by the inner conductor 104 and the outer conductor 102 (which see voltage and current flow and form the output coaxial transmission line). The current path starts at the coaxial output, flows down the inner conductor 104, across the energy storage high voltage capacitor 110, down the center conductor 106, through the photoconductive switch 108, and then flows up and out of the outer conductor 102. The volume between the outer conductor 102 and the inner conductor 104 can be comprised of an air gap, vacuum, or filled with appropriate insulating material.

Figure 2:
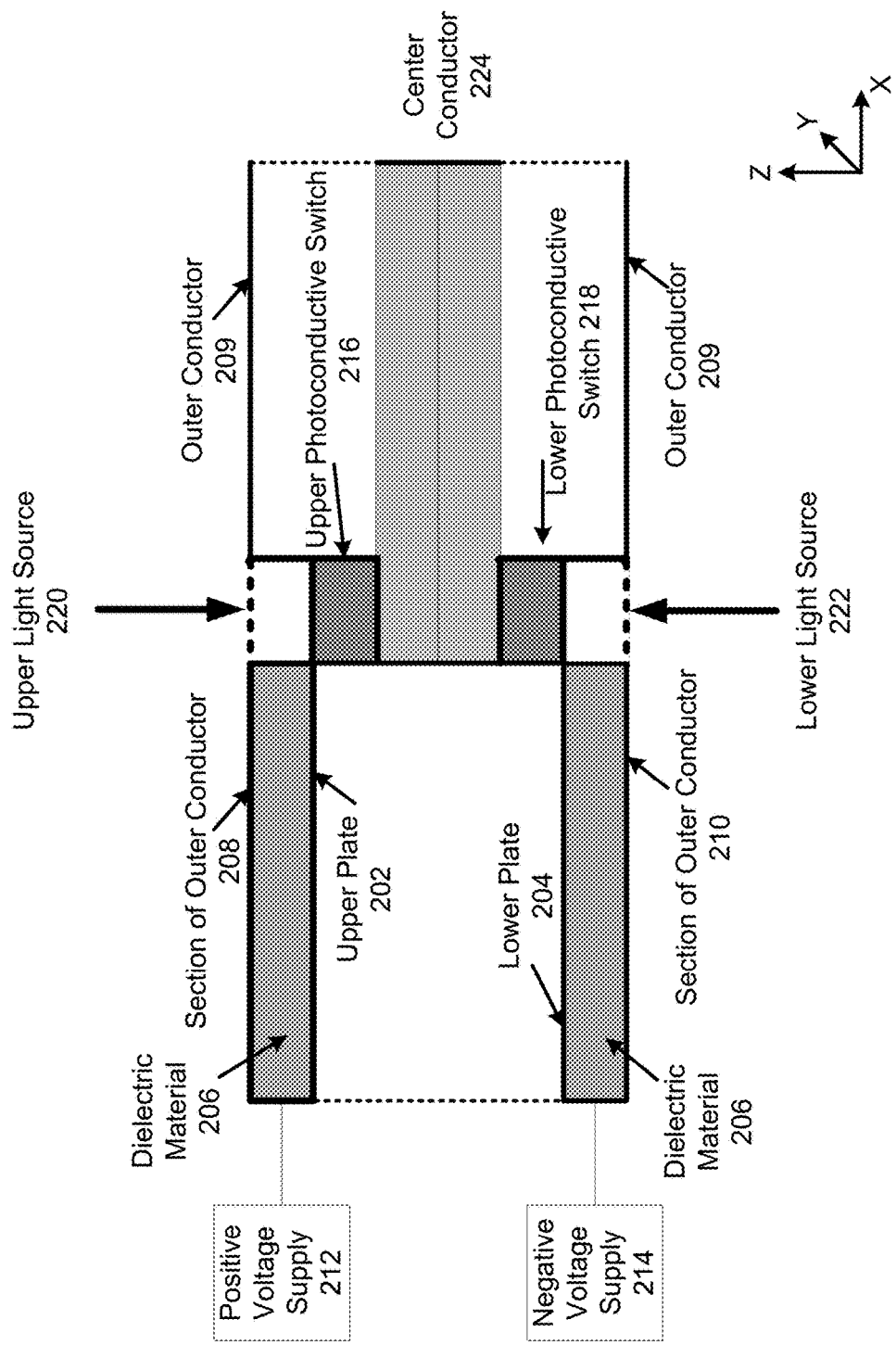
FIG. 2 illustrates a simplified diagram of a bi-triaxial photoconductive switch module in accordance with an exemplary embodiment.

FIG. 2 illustrates basic building blocks of a bi-triaxial photoconductive switch module in accordance with an exemplary embodiment. The bi-triaxial photoconductive switch module of FIG. 2 includes two folded triaxial photoconductive switches that operate based on the principles that were described in connection with FIG. 1. Specifically, an upper high voltage capacitor is formed by placing appropriate dielectric material 206 between an upper plate 202 and a portion of the outer conductor 208. Similarly, a lower high voltage capacitor is formed by placing a dielectric material 206 between a lower plate 204 and a portion of the outer conductor 210 Note that in FIG. 2, different reference numbers 208 and 210 are used to identify the outer conductors that form part of the upper and lower capacitors, respectively. These outer conductors can be different sections of a single outer conductor 209 that forms a casing (e.g., a cylindrical casing) around the bi-triaxial module. Such a casing forms the outer conductor 209 of the output coax formed using the center conductor 224 and the outer conductor 209. Referring back to FIG. 2, an upper photoconductive switch 216 is placed between a section of upper plate 202 and a section of the tri-biaxial module that is electrically coupled to the center conductor 224. The upper photoconductive switch 216 can be activated when light from the upper light source 220 illuminates the photoconductive material of the upper photoconductive switch 216 with sufficient intensity. Similarly, a lower photoconductive switch 218 is placed between a section of lower plate 204 and a section of the tri-biaxial module that is electrically coupled of the center conductor 224. The lower photoconductive switch 218 is activated when light from the lower light source 222 illuminates the photoconductive material of the lower photoconductive switch 218 with sufficient intensity. The upper energy storage capacitor is charged using one voltage supply 212 (e.g., a voltage supply with a positive polarity) and the lower energy storage capacitor is charged using another voltage supply 214 having an opposite polarity with respect to voltage supply 212 (e.g., a voltage supply with a negative polarity).

In some embodiments, the upper (and/or lower) capacitor is formed as a cast-in-place capacitor by pouring or injecting the dielectric material in liquid form in corresponding spaces between the upper plate and the section of the outer conductor (and/or be between the lower plate and the section of the outer conductor), and allowing the dielectric material to settle into a solid form. This way, uniformity of the dielectric material of the energy storage capacitor can be improved. The space between the lower and upper plates can include an air gap or vacuum in order to minimize parasitic capacitance. Additionally, or alternatively, such a gap can be filled with a low dielectric high voltage strength material in order to reduce parasitic capacitance effects between the upper and lower plates.

It should be noted that while FIG. 2 illustrates separate upper and lower light sources, in some implementations, a single light source can be used to provide illumination to both photoconductive switches. In such implementations, one path of light (e.g., light illuminating the lower switch) can be delayed with respect to the other path using, for example, optical fibers or other optical delay components. The light source can include a laser (e.g., a pulse laser source), a laser diode, or, in some implementations, incoherent light (e.g., from an LED) with suitable spectral characteristics that enables activation of the photoconductive switches. In some embodiments, each light source is can be independently and/or separately control the corresponding photoconductive switch.

Figure 3:
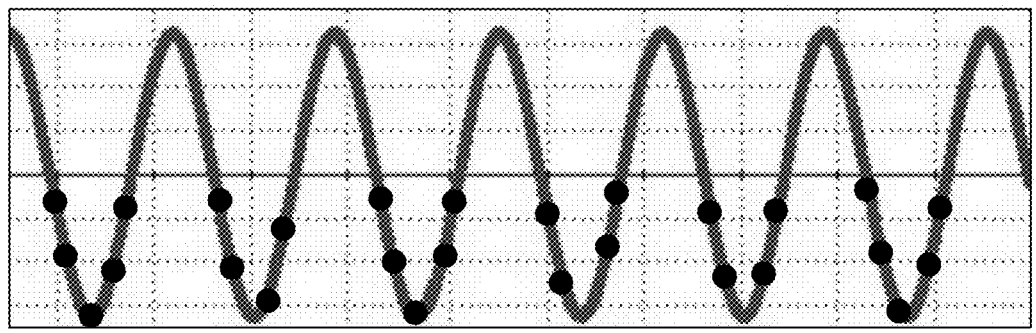
FIG. 3 illustrates a waveform that can be produced at the output of a bi-triaxial photoconductive switch module in accordance with an exemplary embodiment.

The exemplary bi-triaxial photoconductive switch module of FIG. 2 forms a symmetrical structure (e.g., with respect to the X-Y plane that passes through the center of the structure) that can used to generate bipolar waveforms at the output of the module. In one implementation, the bi-triaxial photoconductive switch module of FIG. 2 is operated in a push-pull configuration by charging and discharging the upper and lower high voltage capacitors in an alternate fashion. For example, the sinusoidal waveform that is shown in FIG. 3 represents one example of a bipolar RF output that can be generated using the disclosed bi-triaxial devices. The upper part of the RF output is generated by the upper components of the bi-triaxial device of FIG. 2, when the upper capacitor is charged and discharged (due to activation of the upper photoconductive switch) for several cycles. The lower part of the RF output in FIG. 3 (denoted using filled circles) is generated by the lower components of the bi-triaxial device, when the lower light source activates the lower photoconductive switch and causes the lower capacitor to be discharged. In one example, the upper components of the switch module are pulse-charged to a positive voltage of approximately +20 kV, while the lower components of the switch module are pulse-charged to a negative voltage of approximately −20 kV. It should be noted that FIG. 3 shows an RF output in the form of a simple sinusoid. It is understood, however, that other types of bipolar waveforms, such as square waves, triangular waveforms, etc., can be produced by appropriately charging the high voltage capacitors and controlling the relative phase (or time delay) between activation of the upper and lower photoconductive switches. Arbitrary waveform generators (AWG) are readily available in the commercial sector.

The configuration in FIG. 2 relates to an exemplary bi-triaxial module that uses two triaxial photoconductive switch modules. It is, however, understood that in some embodiments, additional photoconductive switch modules can be coupled together. For example, individual switch elements may be put in serial and/or parallel configurations in order to increase the voltage and/or current handling capability. Thus, a bi-triaxial module may have more than two discrete switches.

Figure 4:
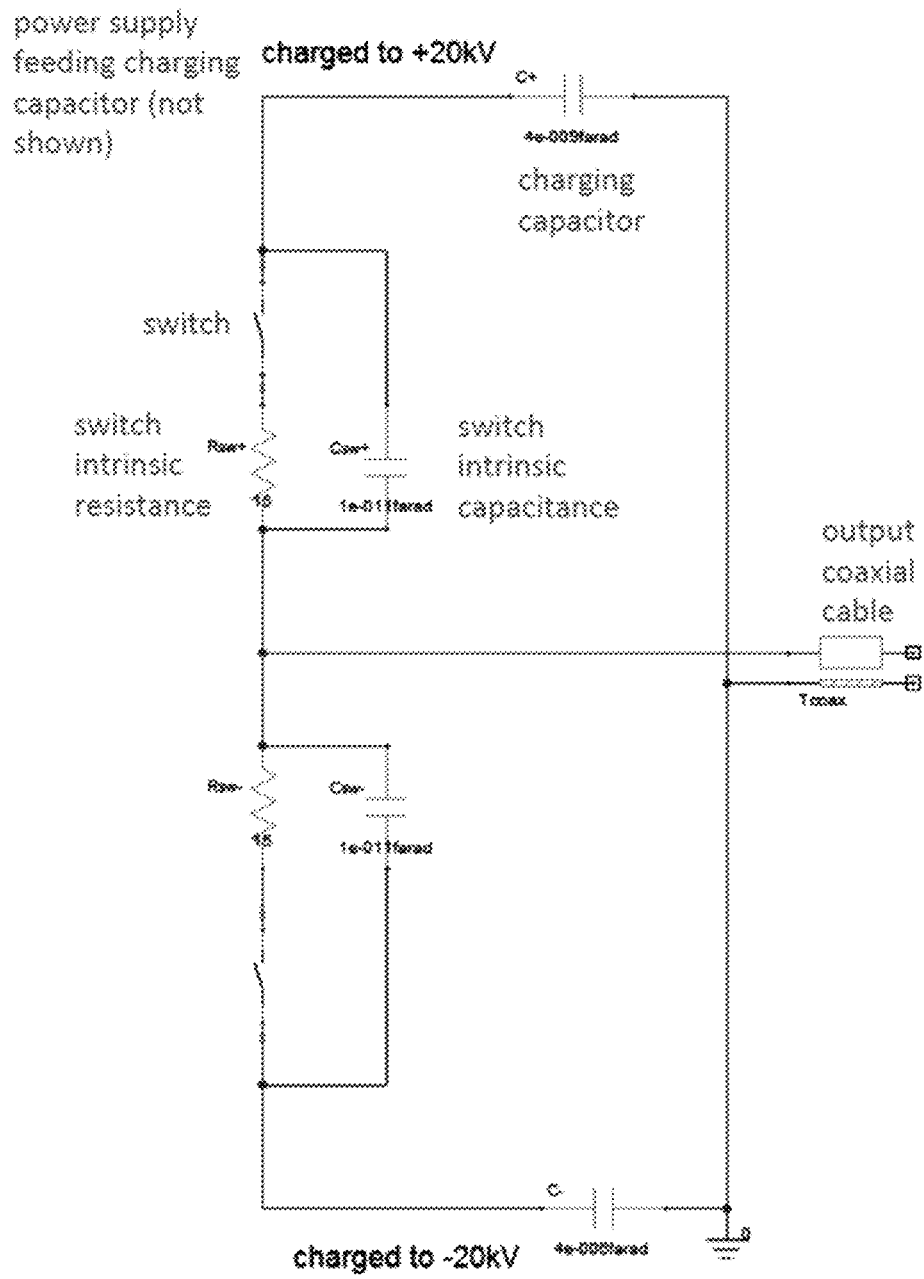
FIG. 4 illustrates a circuit diagram representation of a bi-triaxial photoconductive switch module in accordance with an exemplary embodiment.

FIG. 4 illustrates a circuit diagram representation of a bi-triaxial photoconductive switch module in accordance with an exemplary embodiment. The top half of the circuit representation corresponds to the top biaxial photoconductive switch, and the bottom half of the circuit representation corresponds to the bottom biaxial photoconductive switch. A +20 kV power supply and a −20 kV power supply is shown that charges the upper and lower capacitors, respectively. In one exemplary implementation, the power supplies are high voltage pulsed power supplies and can each include an inductance that limits the RF feedback to the respective power supply. In FIG. 4, each of the upper and lower photoconductive switches is represented by a series combination of a switch and an intrinsic resistance that are in a parallel configuration with an intrinsic capacitance. In the exemplary diagram of FIG. 4, the values of intrinsic capacitance and intrinsic resistance are 15 pF and 15 Ω, respectively. The high voltage storage charging capacitors are shown at the top and bottom of the circuit diagram, with each having an exemplary value of 4 nF. The bi-triaxial RF output is obtained at the common node between the two photoconductive switches and feeds into a matched coaxial cable. Note that the coaxial cable is matched to one switch (not a parallel combination of switches) since only one switch is active at any given time. In one exemplary implementation, the intrinsic or "on" resistance of the photoconductive switch is 15 ohms, and thus a 15-ohm coaxial cable is used. The outer shield of the coaxial cable and the outer housing of the structure are attached to ground for safety reasons.

It should be noted that FIG. 4 does not show the stray capacitance between the upper and lower plates. The value of this capacitance can be minimized by selecting the appropriate material to separate the upper and lower plates, as well as by appropriate geometrical designs of the capacitor plates, as will be described in further detail in later sections of this document.

Figure 5A:
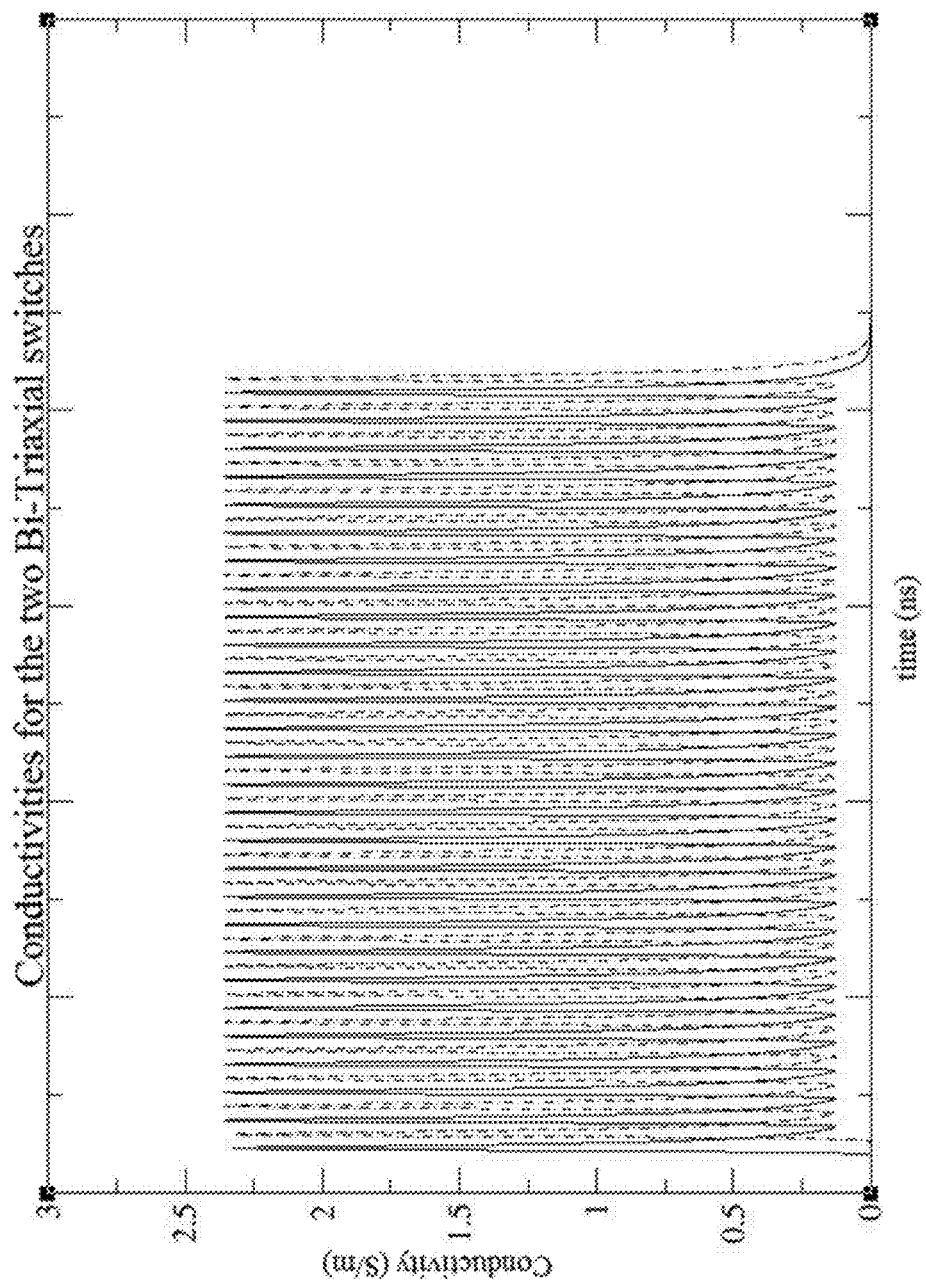
FIG. 5(A) is a plot of conductivities versus time for two photoconductive switches in a bi-triaxial photoconductive switch module in accordance with an exemplary embodiment.
Figure 5B:
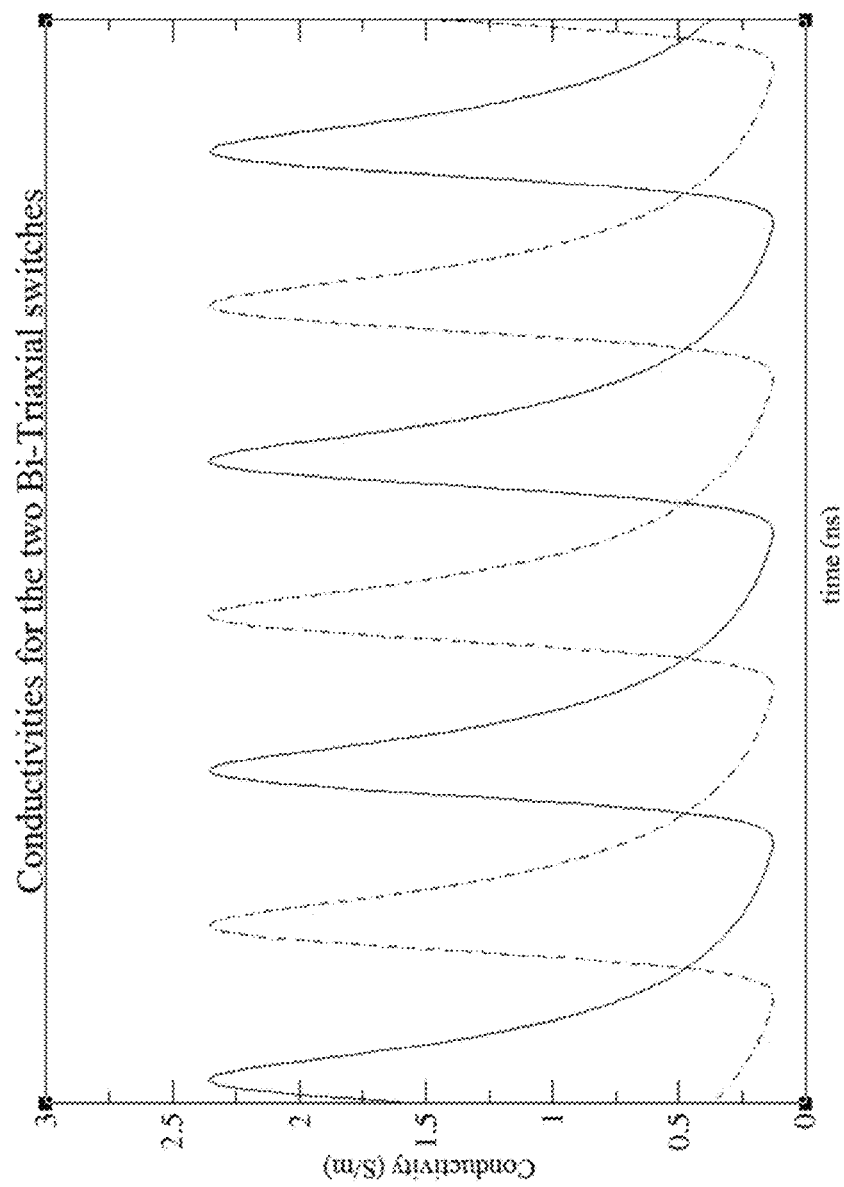
FIG. 5(B) illustrates a magnified section of FIG. 5(A).
Figure 5C:
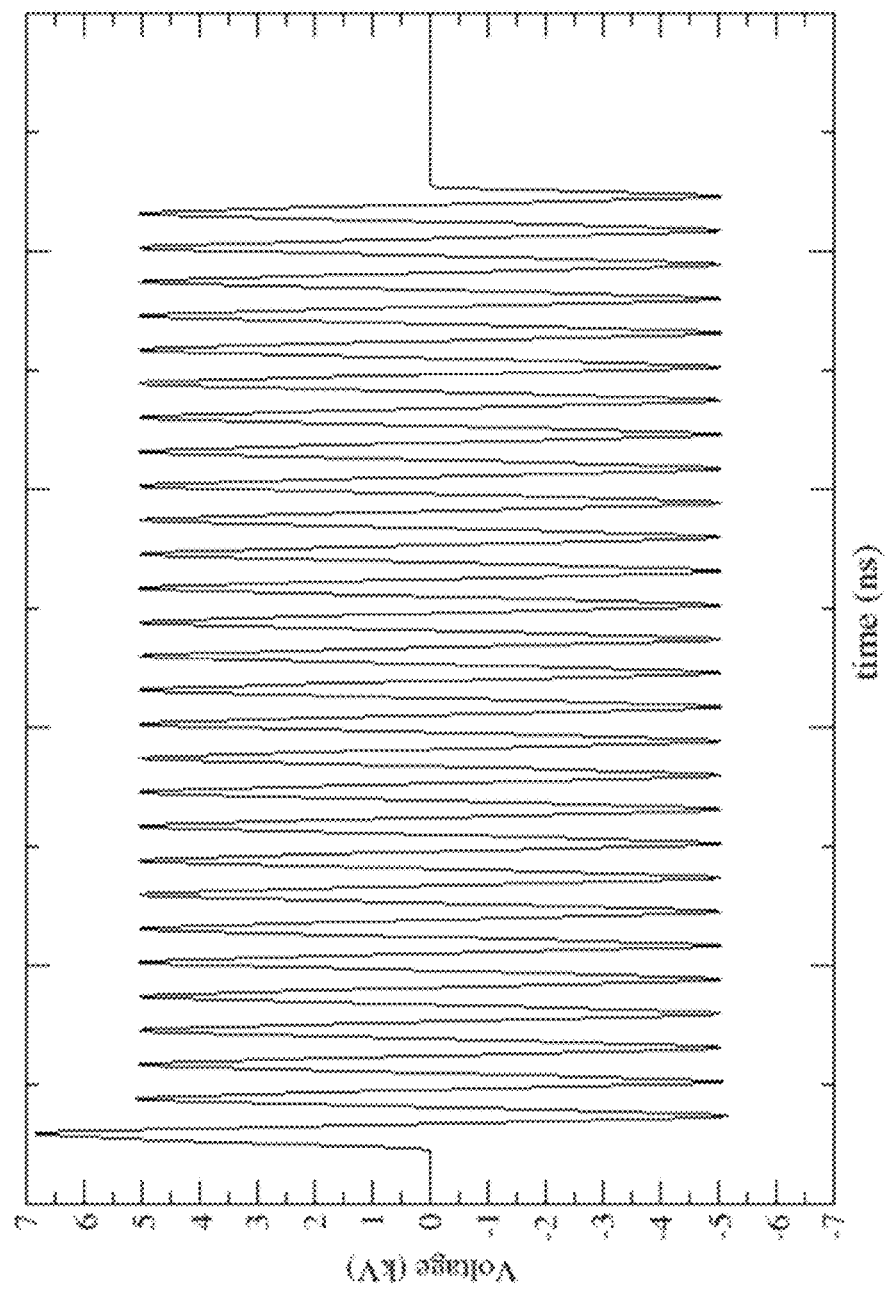
FIG. 5(C) is a plot of an output RF waveform of a bi-triaxial photoconductive switch module in accordance with an exemplary embodiment.

FIG. 5(A) is a plot of conductivity values versus time for two photoconductive switches in a bi-triaxial photoconductive switch module in accordance with one exemplary embodiment. The waveform that is illustrated using solid lines corresponds to conductivity values of the upper photoconductive switch, and the waveform in dotted format illustrates changes in conductivity of the lower photoconductive switch. FIG. 5(B) illustrates a section of FIG. 5(A) in which the time axis is expanded to facilitate viewing of the waveform. As seen from FIGS. 5(A) and 5(B), the optical signals that control the two switches are timed with respect to one another such that the resulting switch conductivities exhibit complementary behavior. The resulting RF output waveform of the bi-triaxial module is illustrated in FIG. 5(C), which shows a symmetric bipolar output in an implementation of the bi-triaxial module having a base diameter of approximately 1 inch, a length of approximately 12 inches, and charging power supplies that energize the charging capacitors with equal but opposite values of ±20 kV. In this exemplary implementation, the 10 kV peak-to-peak output waveform of FIG. 5(C) produces 333 amps of peak current through the bi-triaxial switch module into a 15 ohm output coaxial cable, yielding 1.667 MW peak power. FIG. 5(C) further shows an initial spike in the RF output waveform, which can be mitigated by adjusting the shape or profile of the initial optical waveform that activates the photoconductive switch, and without modifying the geometry or the hardware of the bi-triaxial modules.

Figure 5D:
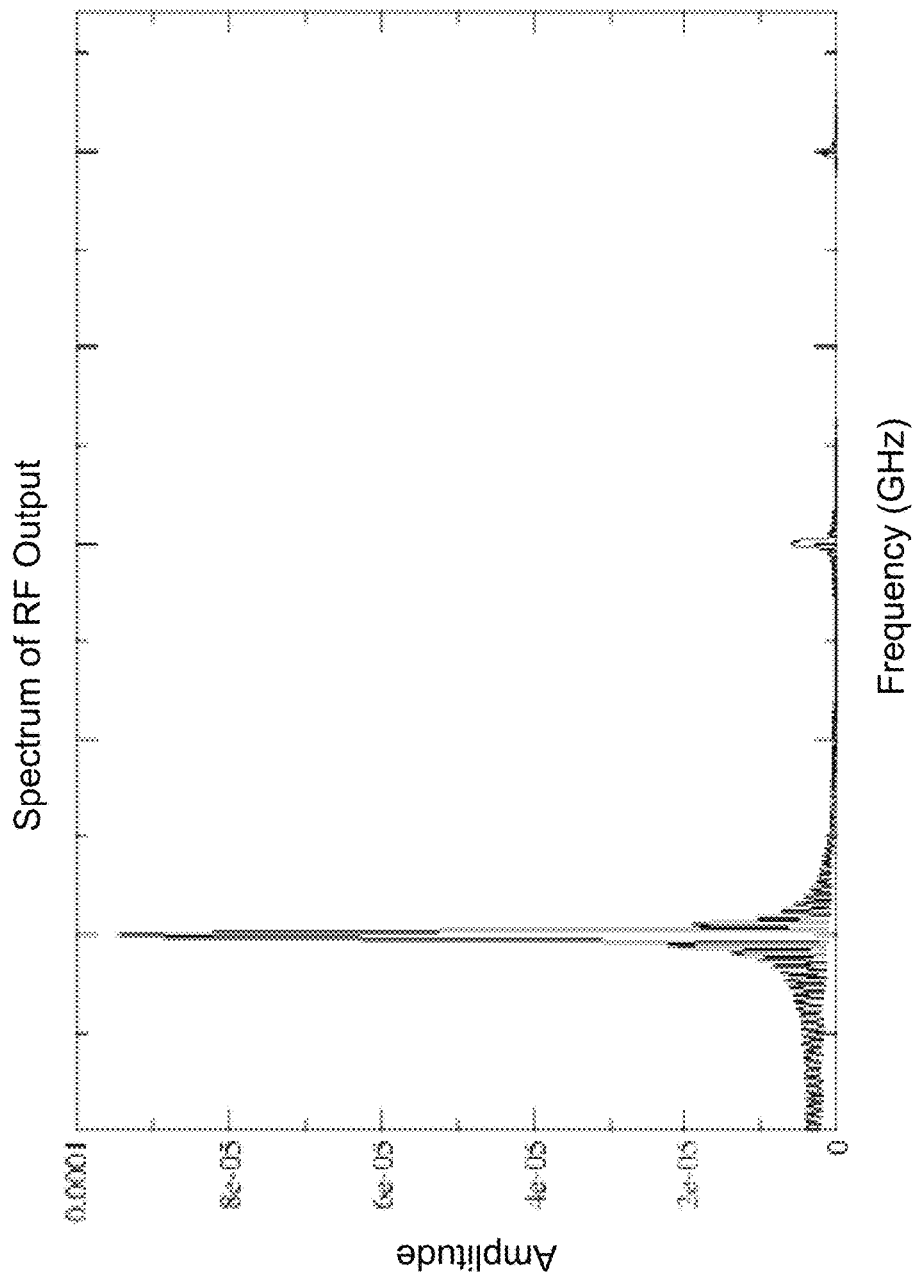
FIG. 5(D) is a plot of an output RF spectrum of a bi-triaxial photoconductive switch module in accordance with an exemplary embodiment.

FIG. 5(D) is a plot of the output RF signal spectrum generated at the coaxial output of a bi-triaxial module in accordance with an exemplary embodiment. It is evident from FIG. 5(D) that the spectral output is quite clean, with a sharp spectral peak and small harmonics. The small DC component of the spectral output that is seen in FIG. 5(D) is largely due to the initial output pulse being larger than all subsequent balanced pulses.

It should be further noted that while in the above description and throughout this document the terms "upper" and "lower" are used to describe some of the components of the disclosed bi-triaxial photoconductive switch modules, these terms are merely used to facilitate the understanding of the disclosed technology. Thus, alternate terminology, such as "first" and "second," "one" and "another," and others, may also be used to refer to such components. Further, as noted earlier, more than two triaxial photoconductive switch modules may be coupled to form a bi-triaxial switch module. Thus the use of the above terminology should not be construed as limiting the disclosed modules to only two triaxial modules or components thereof.

Figure 6:
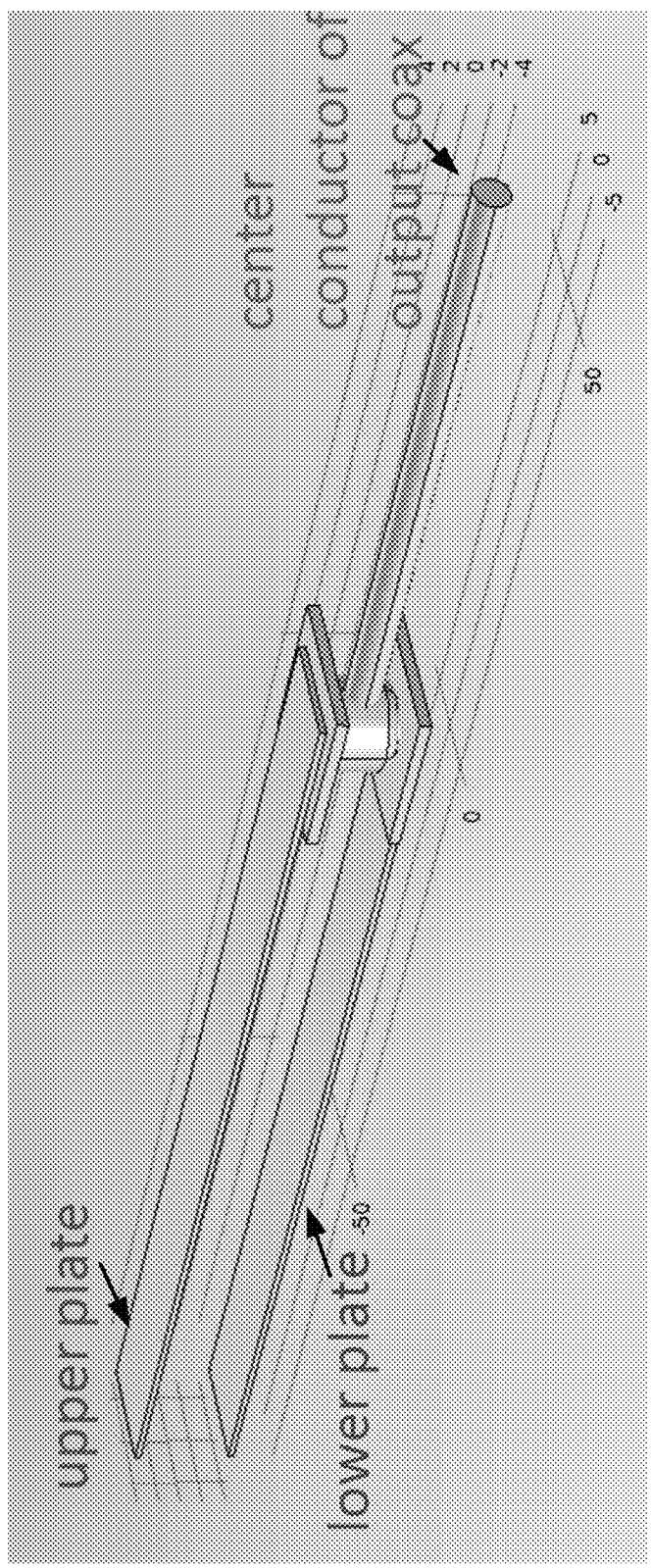
FIG. 6 illustrates a three-dimensional view of some of the components of a bi-triaxial photoconductive switch module in accordance with an exemplary embodiment. In this case, only the inner metal components and switches are shown.

FIG. 6 illustrates a three-dimensional view of some of the components of a bi-triaxial photoconductive switch module in accordance with an exemplary embodiment. In particular, FIG. 6 illustrates the relative dimensions and positioning of the upper plate, the lower plate, and the center conductor of the output coaxial cable. As evident from FIG. 6, the upper and lower plates have substantially similar dimensions and are symmetrically positioned with respect to the longitudinal axis of the bi-triaxial module.

Figure 7:
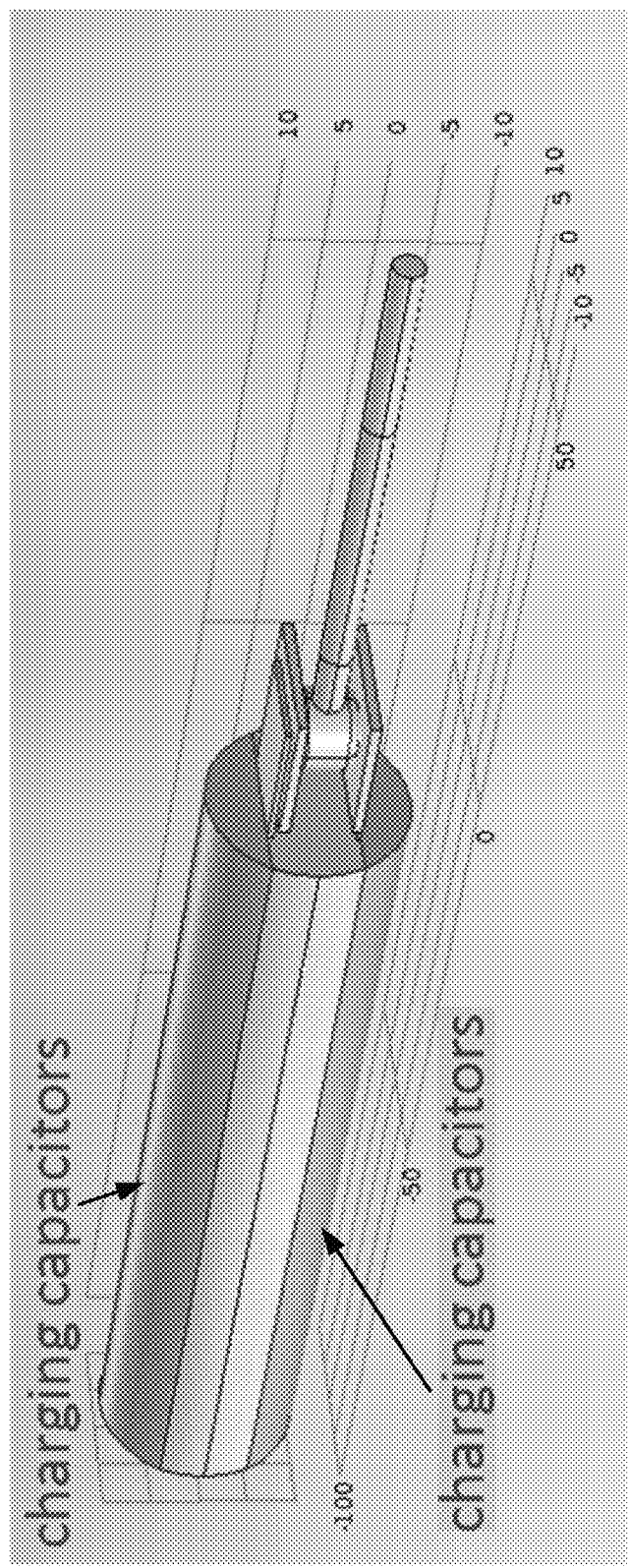
FIG. 7 illustrates another three-dimensional view of some of the components, including the charging capacitors, of a bi-triaxial photoconductive switch module in accordance with an exemplary embodiment. In this case, the inner metal components, switches, and charging capacitors are shown.

FIG. 7 illustrates another three-dimensional view of some of the components of a bi-triaxial photoconductive switch module in accordance with an exemplary embodiment. The rounded sections above and below the upper and lower plates, respectively, illustrate the dielectric material of the upper and lower cast-in-place high voltage capacitors. An outer shell and/or outside conductor (not shown) surrounds the rounded sections of capacitors. For illustration purposes, FIG. 7 also shows the volume between the upper and lower plates that is filled-in with an appropriate material. However, as noted earlier, the volume between the two plates can include an air gap, vacuum, and/or a material with appropriate electrical characteristics to minimize the parasitic capacitive effects between the upper and lower plates.

Figure 8:
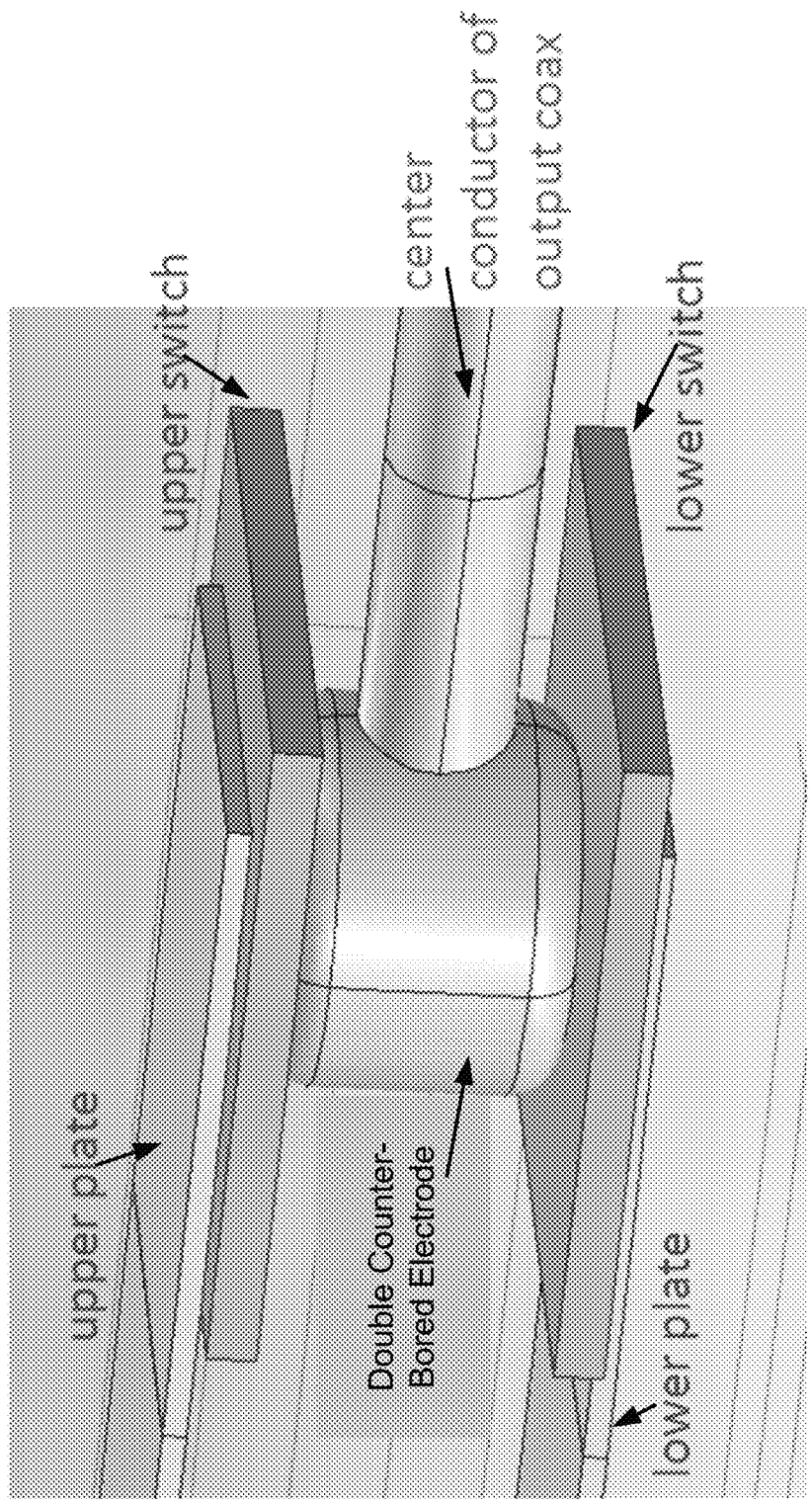
FIG. 8 illustrates another three-dimensional view of some of the components, including the center conductor, of a bi-triaxial photoconductive switch module in accordance with an exemplary embodiment. In this case, only the plates, switches, and center of the output coax are shown.

FIG. 8 illustrates another three-dimensional view of some of the components of a bi-triaxial photoconductive switch module in accordance with an exemplary embodiment. In particular, FIG. 8 shows an upper photoconductive switch that is placed between an upper plate and a center electrode. The illustrated center electrode is a larger double counter-bored electrode that is coupled to a center coax conductor having a smaller diameter. As noted earlier, the output coax cable is selected to match the impedance characteristics of the photoconductive switches. In some implementations, an opening (not shown in FIG. 8) within a section of each of the upper and lower plates allows light to be coupled to the photoconductive material of the corresponding switches (see FIGS. 12(A) and 12(B) that illustrate exemplary openings that enable delivery of light to the photoconductive switches). Light delivery can be effectuated using optical fibers, free space optics, or other means.

Figure 9:
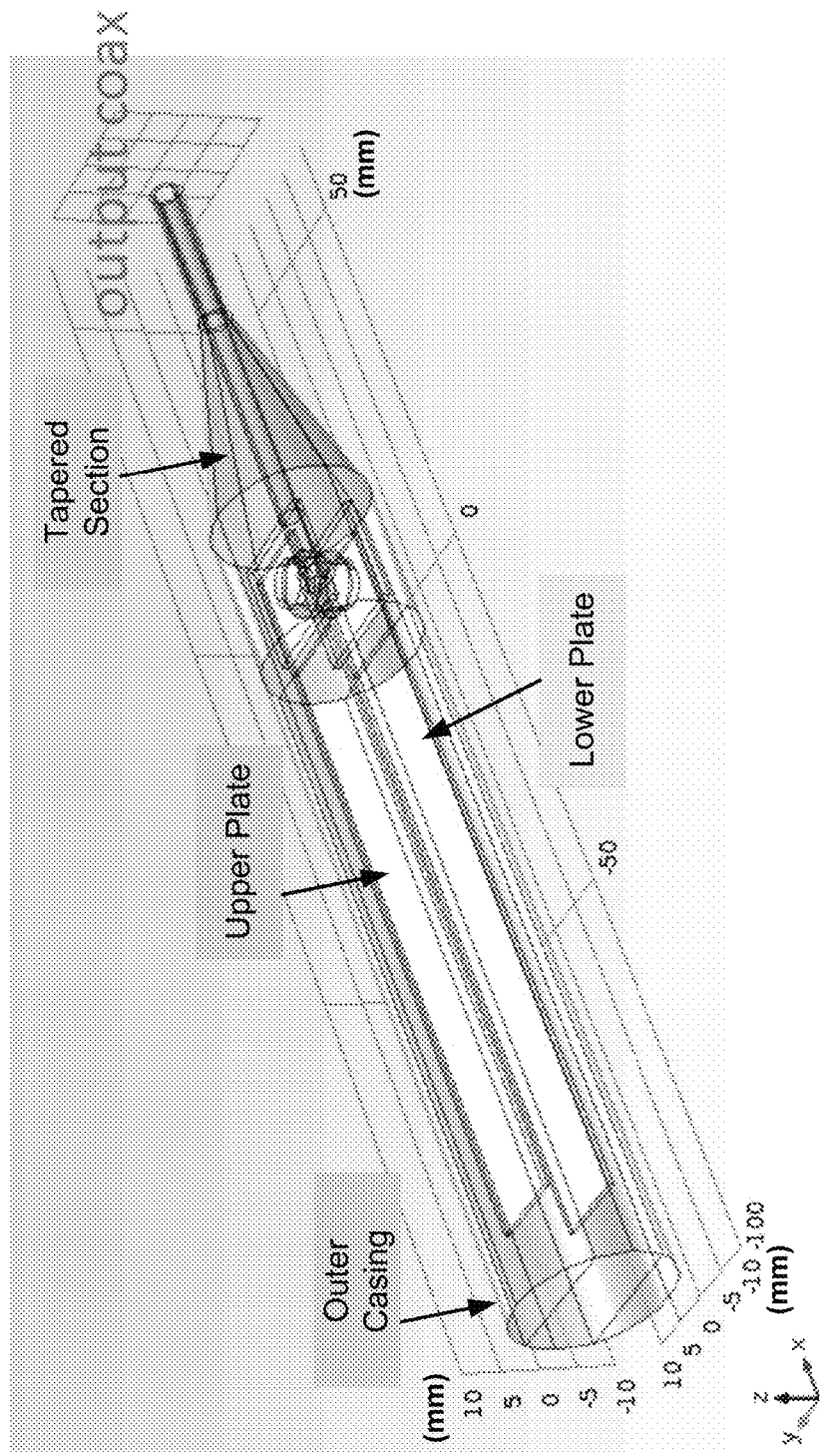
FIG. 9 illustrates another three-dimensional view of some of the components, including an outer casing, of a bi-triaxial photoconductive switch module in accordance with an exemplary embodiment. In this case, the metal components, switches, charging capacitors, and tapered coaxial section are shown.

FIG. 9 illustrates another three-dimensional view of some of the components of a bi-triaxial photoconductive switch module in accordance with an exemplary embodiment. In FIG. 9, an outer casing, as well as a tapered front section of the triaxial photoconductive switch module, are shown to illustrate the overall shape of an exemplary bi-triaxial module. The outer casing forms a cylindrical enclosure with a tapered front end. The tapered end has a cone-shaped surface forms a structures that allows the outer conductor to be coupled to an appropriately impedance-matched coaxial cable while providing a compact form factor. As evident from the illustrations in FIGS. 6 to 9, the disclosed triaxial photoconductive switch modules can be manufactured using a relatively few number of parts. Furthermore, the elongated and compact geometry of the bi-triaxial photoconductive switch module allows a plurality of such modules to fit within a small volume of space. For example, a large number of such modules can be stacked on top and next to each other to form an X-Y array of modules, which can be used for feeding an X-Y antenna array.

The exemplary bi-triaxial photoconductive switch module in FIG. 9 is approximately 150 mm long, and has a base diameter of roughly 20 mm at its larges cross-section. These dimensions can be modified as needed to satisfy various design needs and to improve RF output characteristics. In one example, the length of the module is doubled (e.g., to approximately 300 mm) to reduce RF output degradations due to back reflections.

Figure 10:
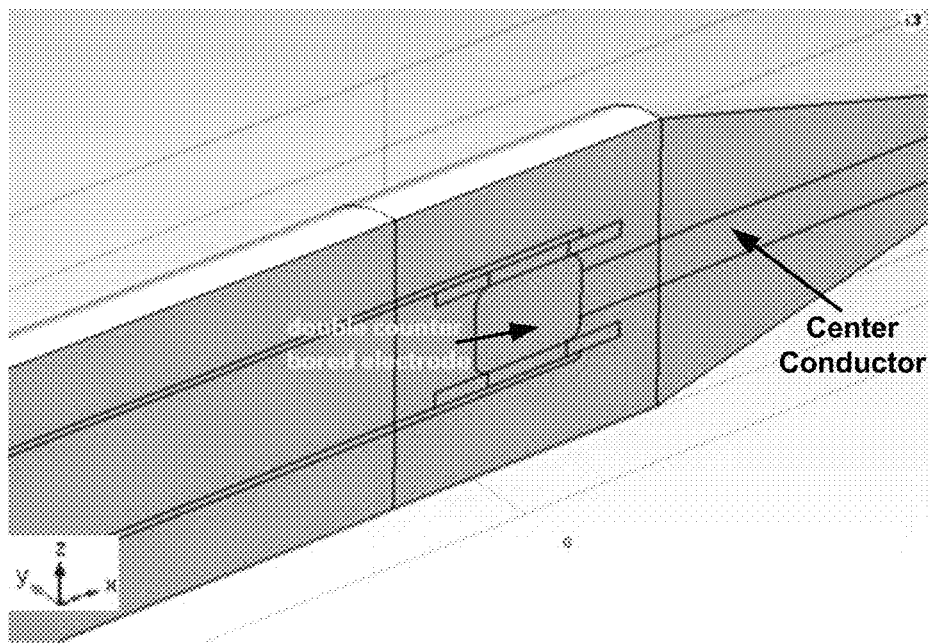
FIG. 10 illustrates a cross-sectional view of a bi-triaxial photoconductive switch module that utilizes a double counter-bored electrode in accordance with an exemplary embodiment.
Figure 11:
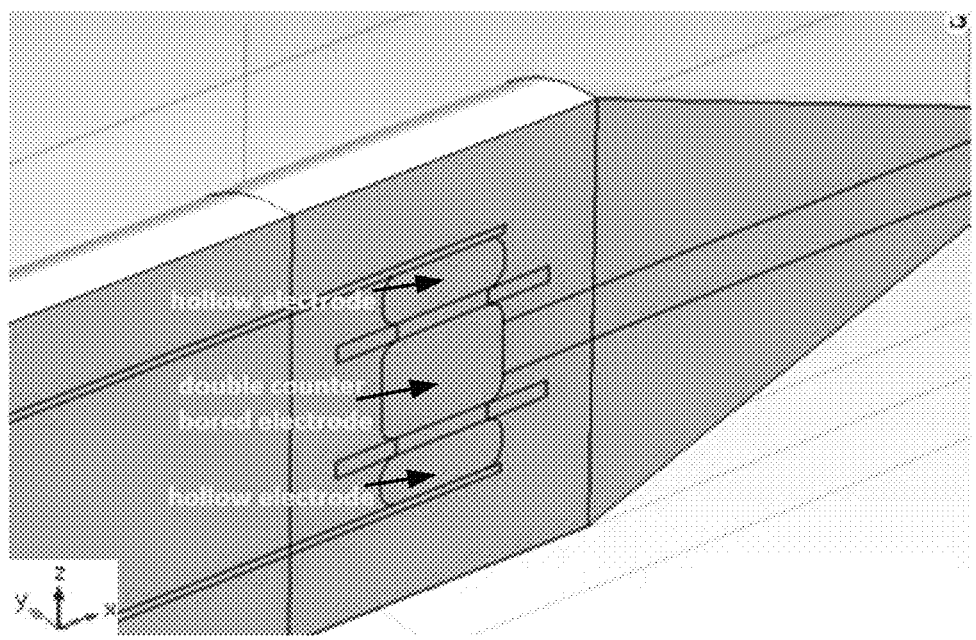
FIG. 11 illustrates a cross-sectional view of a bi-triaxial photoconductive switch module that utilizes an alternate hollow electrode with double counter-bored electrode in accordance with an exemplary embodiment.

FIG. 10 illustrates a cross-sectional view of a bi-triaxial photoconductive switch module that utilizes a double counter-bored electrode in accordance with an exemplary embodiment. The module of FIG. 10 illustrates a simple and cost-effective configuration for producing such modules. In FIG. 10, the double counter bored electrode and associated output coax center conductor further serves as a cold plate for cooling the photoconductive switches. Heat is removed via the center conductor. FIG. 11 illustrates a cross-sectional view of a bi-triaxial photoconductive switch module that utilizes an alternate hollow electrode with double counter-bored electrode in accordance with an exemplary embodiment. In particular, the upper (or first) hollow electrode is positioned between the upper plate and the upper photoconductive switch, the lower (or second) hollow electrode is positioned between the lower plate and the lower photoconductive switch, and the double counter-bored electrode is positioned between the upper photoconductive switch and the lower photoconductive switch. In the configuration of FIG. 11, each photoconductive switch is fed with light through corresponding hollow electrodes and transparent electrodes, and optical reentrant cavities in the double-bored electrode to increase optical scattering. Note that the optical fiber and optical pathways are not shown in FIG. 11 since those components are composed of glass and plastic, and do not significantly affect the RF signals.

Figure 12A:
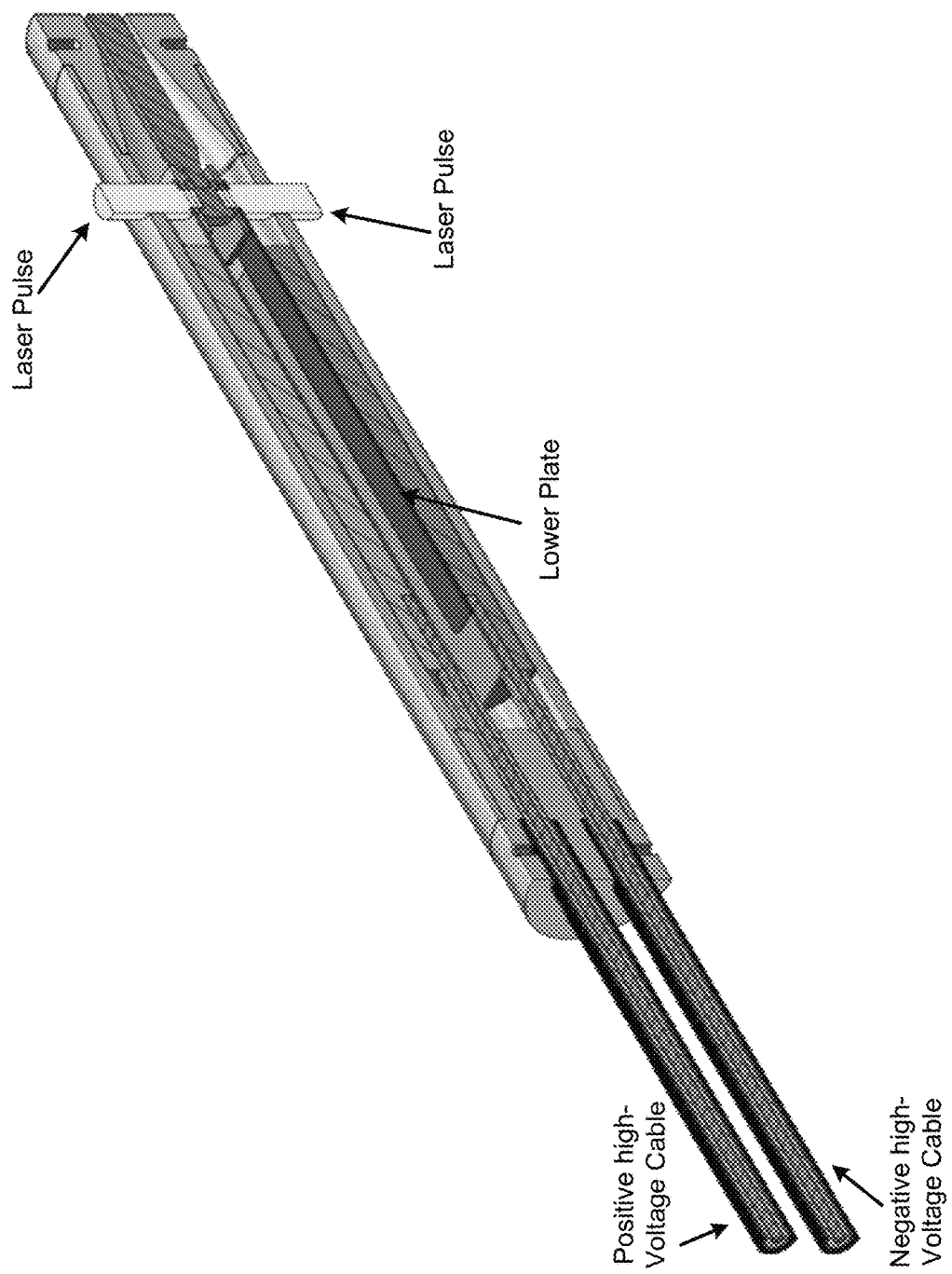
FIG. 12(A) illustrates a three-dimensional view of sections of a bi-triaxial photoconductive switch module that utilizes alternate hollow electrode with double counter-bored electrode in accordance with an exemplary embodiment.
Figure 12B:
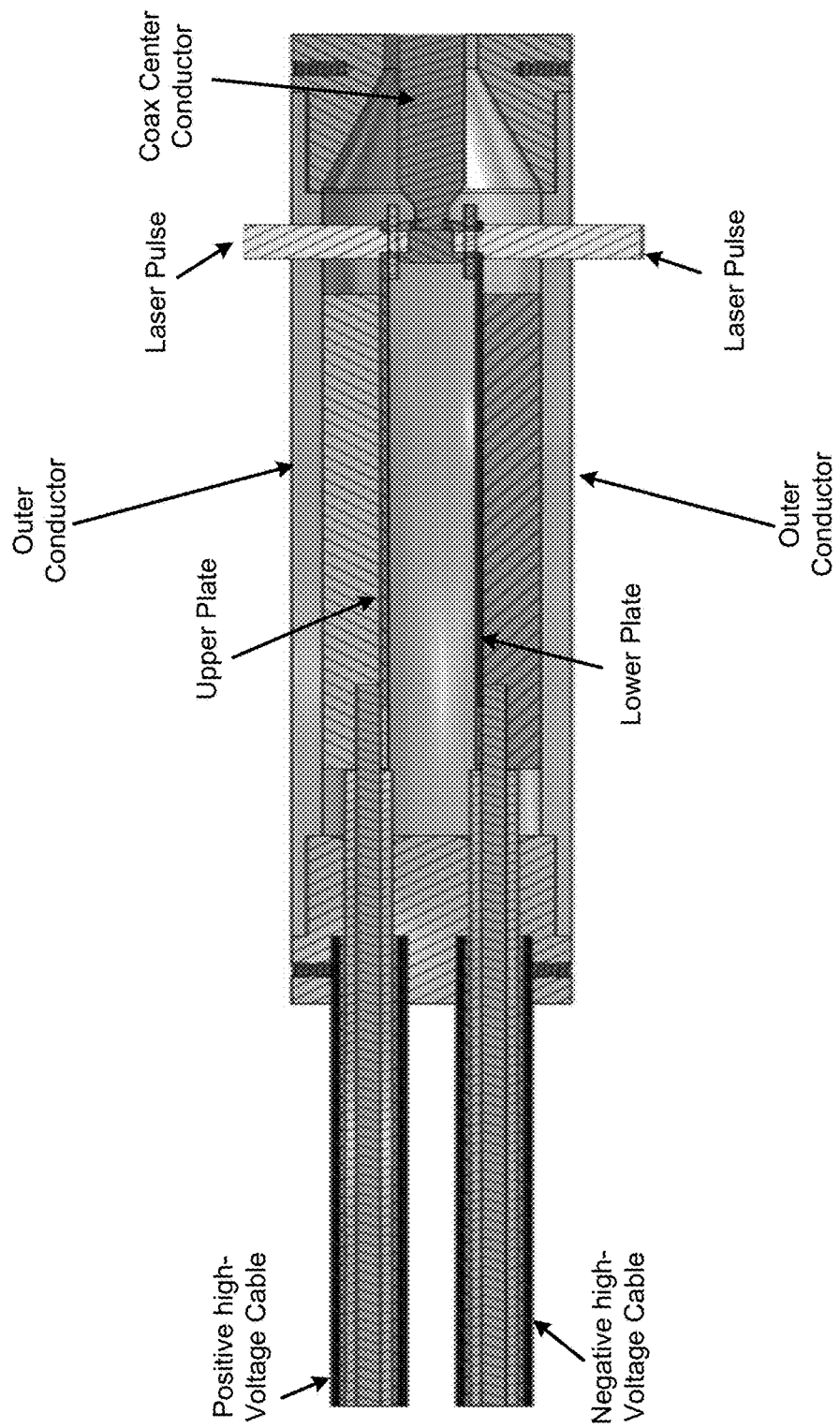
FIG. 12(B) illustrates a cross-sectional view of the bi-triaxial photoconductive switch module of FIG. 12(A).

FIGS. 12(A) and 12(B), respectively, illustrate a three-dimensional and a cross-sectional view of a bi-triaxial photoconductive switch module that utilizes alternate hollow electrode with double counter-bored electrode in accordance with an exemplary embodiment. The bi-triaxial photoconductive switch module is supplied using positive and negative high voltage cables for charging the capacitors. In some implementations, due to the compact nature of the modules, the high voltage charging lines use pigtails to supply the large voltage values (e.g., ±20 kV). The laser light illuminates the upper and lower photoconductive switches through openings in the outer conductor. The illustrated optical paths (e.g., pulsed laser paths) to the upper and lower photoconductive switches are free-space optical paths. However, in some implementations, optical fibers or other types of waveguides can be used to deliver the light. The upper and lower photoconductive switches are isolated from one another, and each operate in response to the corresponding light that impinges on the particular switch. As noted earlier, the bi-triaxial module can produce a bipolar RF output. Such an output can be used to, for example, deliver power to an antenna.

Figure 13:
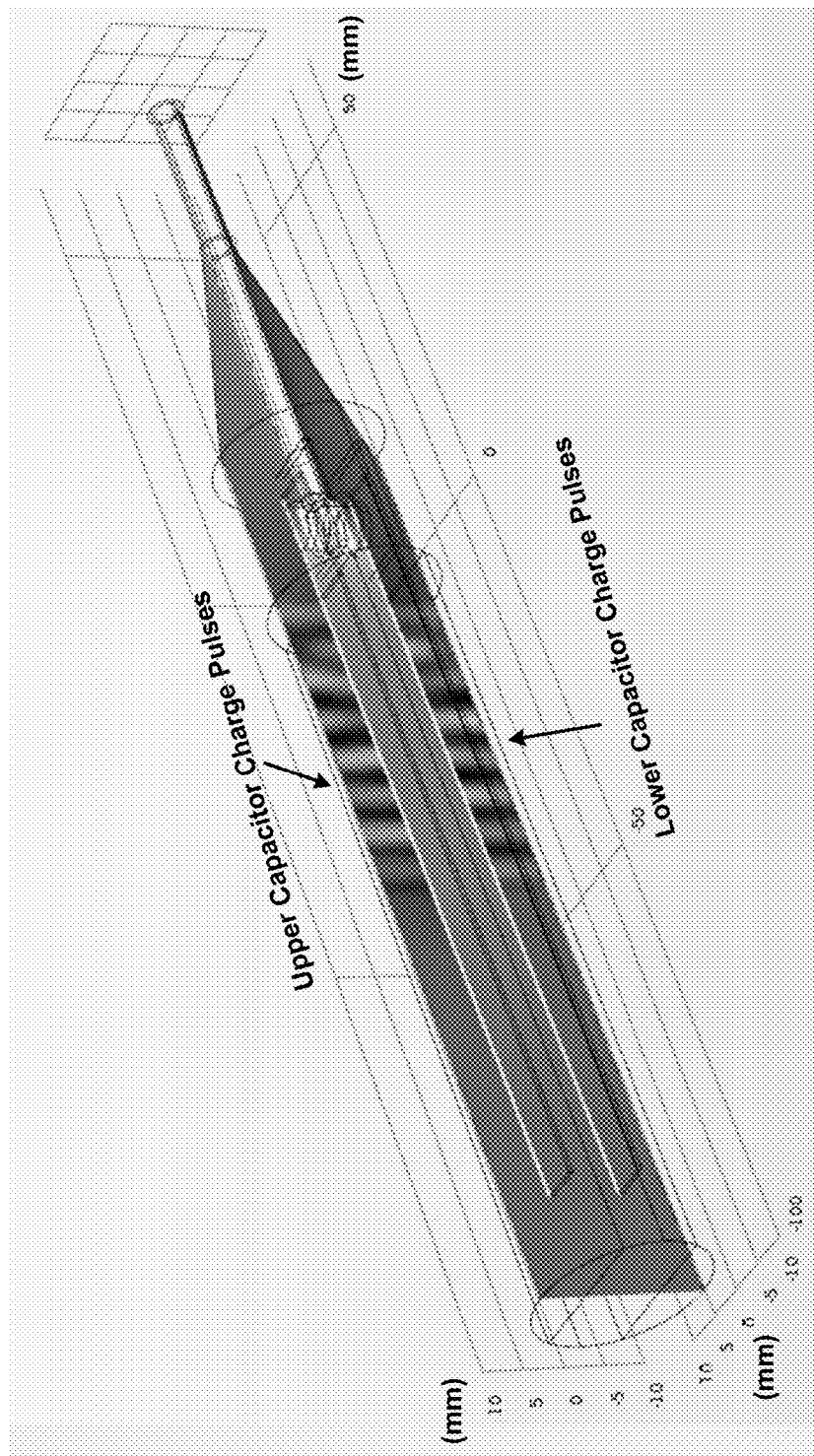
FIG. 13 is plot of magnetic field across various sections of a bi-triaxial photoconductive switch module in accordance with an exemplary embodiment.

FIG. 13 is a plot of magnetic field (A/m) across various sections of a bi-triaxial photoconductive switch module in accordance with an exemplary embodiment. The plot shows a snap shot in time of the magnetic field when several voltage cycles have been produced upon alternative activation of the upper and lower photoconductive switches. The individual cycles are evident in the charging capacitors due to the high dielectric constant of these capacitors.

Figure 14:
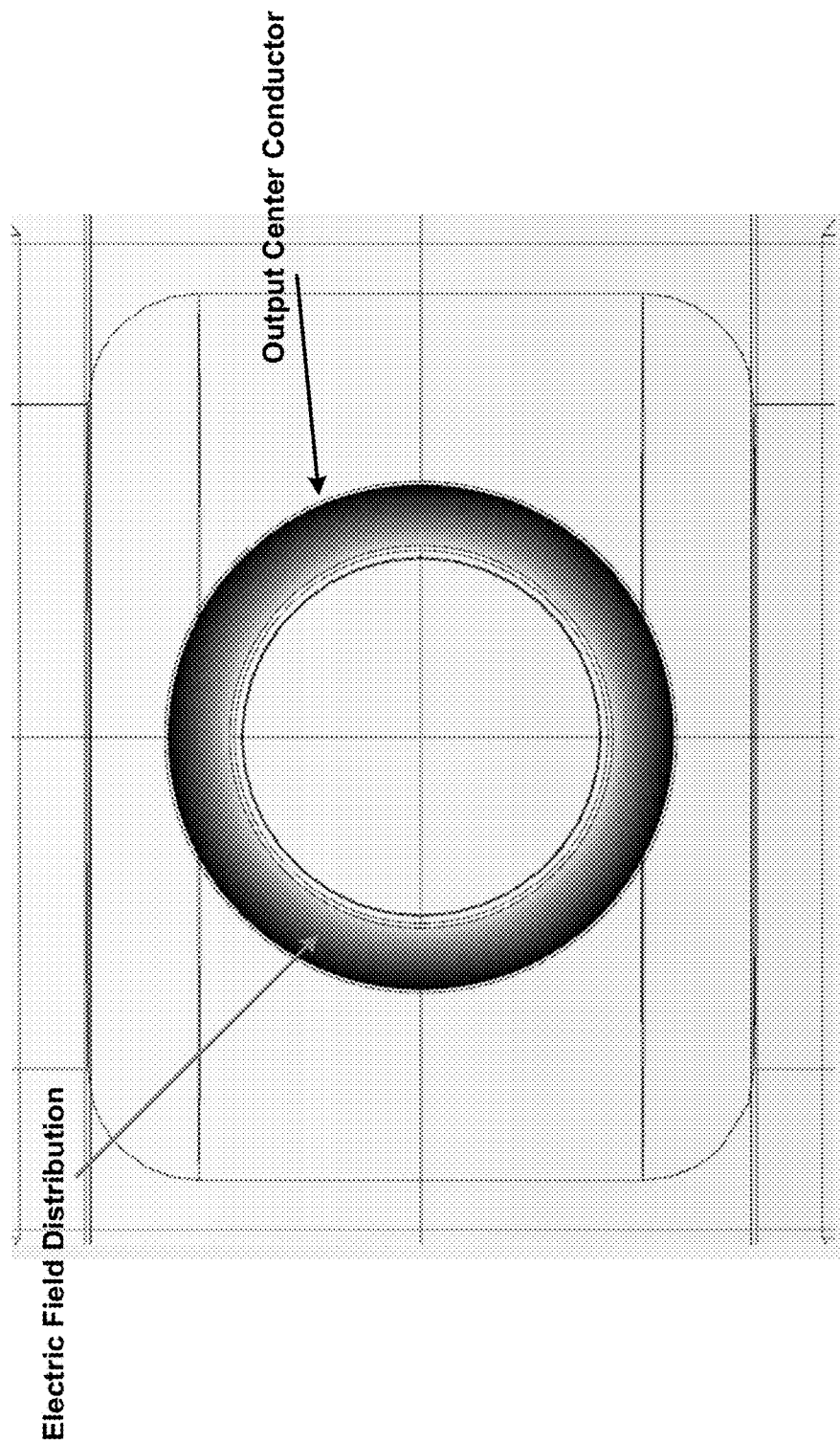
FIG. 14 is a plot of electric field strength at the coaxial output of an exemplary bi-triaxial photoconductive switch module in accordance with an exemplary embodiment.

FIG. 14 is a plot of the electric field strength (V/m) at the coaxial output of an exemplary bi-triaxial photoconductive switch module in accordance with an exemplary embodiment. The cross-sectional view of FIG. 14 illustrates a uniform electric field distribution associated with the bipolar RF output waveform that exhibits the classic coax radial variation.

As noted earlier, the configuration of the upper and lower parallel plates, as shown, for example, in FIG. 2, can introduce stray or parasitic capacitance between those plates. In some exemplary embodiments, in order to reduce the capacitive effects between the two plates, one or both of the upper and lower plates are rotated so that the cross-sectional area of the plates that face one another is reduced. This feature of the disclosed embodiments can be better understood by comparing FIGS. 15 and 16.

Figure 15:
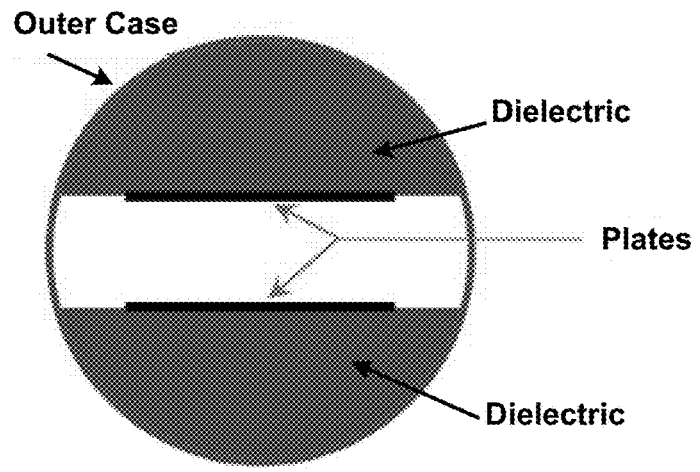
FIG. 15 illustrates a cross-sectional view of the high voltage capacitors with the upper and lower plates oriented in a particular configuration in accordance with an exemplary embodiment.

FIG. 15 illustrates a cross-sectional view of the high voltage capacitors in which the upper and lower plates are oriented in a similar manner as those in FIGS. 6 to 9. That is, both the first plate and the second plate are positioned in a parallel configuration with respect to the longitudinal axis of the bi-triaxial photoconductive switch module (shown as the x-axis in FIG. 9), or in parallel to the X-Y plane. FIG. 15 shows a cross-sectional view of such a parallel configuration having two cast-in-place capacitors, each formed between one of the plates and the part of the domed-shaped outer case of the bi-triaxial module. For example, the cross-sectional view of FIG. 15 can correspond to the charging capacitors that are shown in FIG. 7. Assuming that the first plate is characterized as having a first length, a first width and a first thickness, and the second plate as having a second length, a second width and a second thickness, in this configuration, the rectangular area of the first plate having the first length and the first width faces the rectangular area of the second plate having the second length and the second width.

Figure 16:
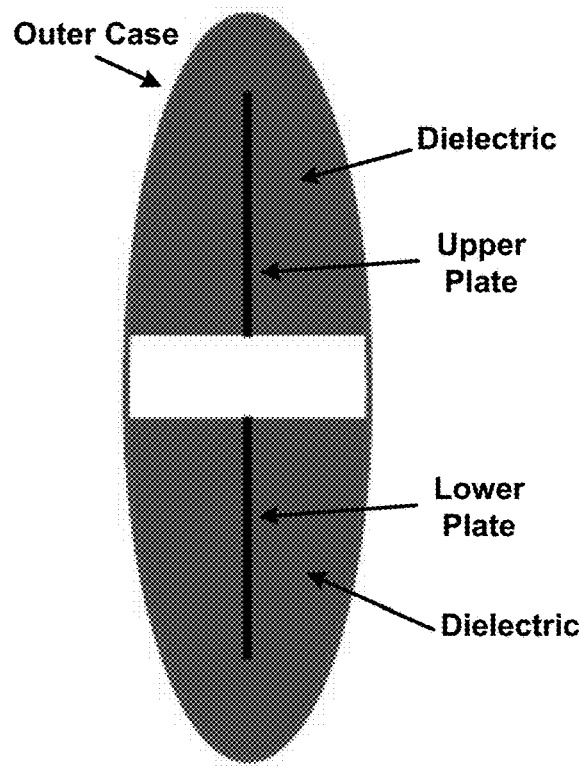
FIG. 16 illustrates a cross-sectional view of the high voltage capacitors in accordance with an exemplary embodiment in which the upper and lower plates are oriented by 90 degrees with respect to those in FIG. 15.

FIG. 16 illustrates a cross-sectional view of the high voltage capacitors in which the upper and lower plates are oriented by 90 degrees with respect to those in FIG. 15. In general, one or both plates can be rotated by as much as 90 degrees to reduce the parasitic capacitance formed by the sections of the upper and lower plates that face one another. That is, one or both of the plates are positioned in an angled configuration with respect to a longitudinal axis of the bi-triaxial photoconductive switch module such that a rectangular area, or a portion thereof, of the first plate does not face a rectangular area, or a portion thereof, of the second plate. To accommodate this rotated plate configuration, the outer casing of the bi-triaxial module can be structured to have an elliptical profile (as shown in FIG. 16). In general, the outer casing of the bi-triaxial module can be non-circular and non-rectangular. An elliptical profile is one example that is both non-circular and non-rectangular, while at the same time reduces electromagnetic field enhancements because it lacks any sharp corners. In some implementations, only a section of the plates is rotated. For example, in a configuration with a 10-inch-long plate, only an 8-inch section of each plate closest to the photoconductive switch area is rotated by as much as 90 degrees, while the remaining 2-inch section is un-rotated and placed in the background fluorenert bath, oil, or other high voltage dielectric material (solid or liquid) for high-voltage connectivity purposes. For comparison purposes, the capacitance value between two parallel plates having an identical rectangular area of 10"×1 cm is approximately 4.7 pF. Rotating an 8-inch-long section of each plate by 90 degrees reduces the capacitance to about 1 pF.

Figure 17:
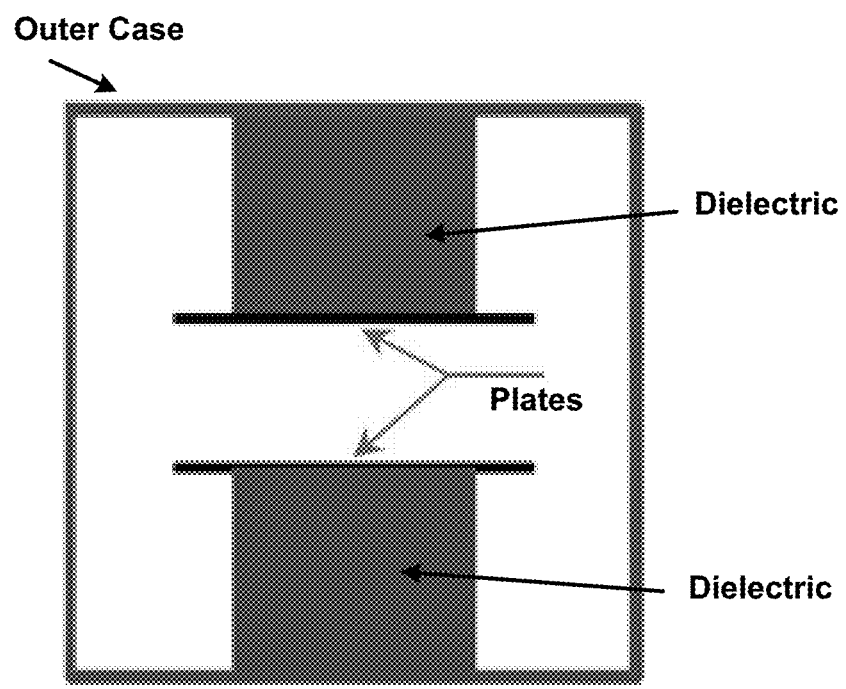
FIG. 17 illustrates a cross-sectional view of a discrete capacitor that can form at least part of the high voltage capacitors of a bi-triaxial photoconductive switch module in accordance with an exemplary embodiment.

In some implementations, at least a section of the high voltage capacitor can be formed using a discrete capacitor. FIG. 17 illustrates a cross-sectional view of a discrete capacitor that can form at least part of the high voltage capacitors of a bi-triaxial photoconductive switch module in accordance with an exemplary embodiment. Continuing with the example dimensions of 10"×1 cm, one or more discrete capacitors can be placed along an 8-inch section of the plates. In this configuration, the bi-triaxial module may be implemented with a square outer casing may be implemented to accommodate the square shape of the discrete capacitor. Commercially available high voltage capacitors are typically described as door-knob capacitors and can fit into this configuration. Discrete capacitors can provide benefits in terms of simplifying the design, and perhaps manufacturing costs, but the cast-in-place capacitor design is better suited for more complex designs.

While the above embodiments have been described to provide specific exemplary implementation of a bi-triaxial switch module, it is understood that variations to the disclosed embodiments may be implemented within the scope of this disclosure. For example, in some implementations, the optical pulses that activate the photoconductive switches can be temporarily shortened to minimize the amount of optical overlap (i.e., during the times when both switches are in the conductive "on" state). Using this technique, the output voltage of the bi-triaxial module can be increased by as much as 40%. For the example, for the configuration that produced the output voltage of FIG. 5(C), this improvement amounts to having a peak-to-peak voltage of 14 KV, and an associated increase of output peak power from 1.667 MW to 3.27 MW into a 15 Ω coaxial cable.

In some implementations, the output RF signal can be further improved by reducing or avoiding the tapered region of the bi-triaxial module. One way to accomplish this is to select an output coaxial cable that better matches the inner and outer dimensions of the bi-triaxial module.

The disclosed bi-triaxial photoconductive switch modules address a number of issues associated with existing photoconductive RF modules including elimination of DC blocking capacitors, reducing the photoconductive switch current by as much as 2X to 3X, providing a highly compact structure, and utilizing unified cast-in-place capacitors that can be designed with an appropriate geometry, volume and orientation to provide desired energy storage capacity while eliminating or reducing parasitics. The disclosed bi-triaxial photoconductive switch modules further allow for a unified output region so that the device has a high aspect ratio, which produces a long and skinny form factor that facilitates delivery of the output RF power to, for example, XY antennas arrays.

A bi-triaxial photoconductive switch modules can be operated as follows: a standard high voltage power supply charges up the charging capacitors; the first laser delivers photons to the first photoconductive switch to the photoconductive switch (e.g., through the transparent electrode), thus forming the first half-cycle of the RF waveform. The second laser delivers photons to the second photoconductive switch, out of phase (e.g., through a transparent electrode), thus forming the second half-cycle of the RF waveform. The output RF waveform is formed from these two half-cycles and propagates along the coaxial output transmission line.

Figure 18:
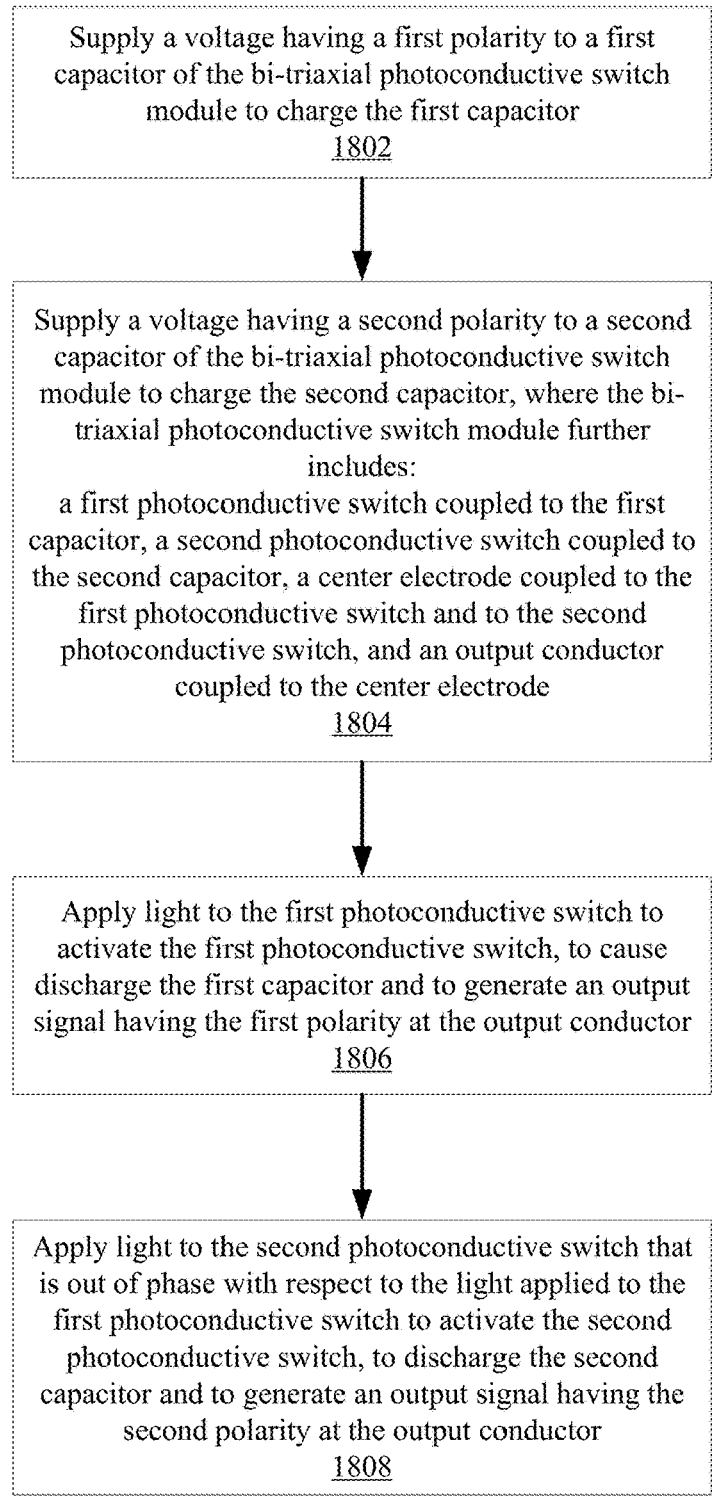
FIG. 18 illustrates a set of exemplary operations that can be carried out to operate a bi-triaxial photoconductive switch module in accordance with an exemplary embodiment.

FIG. 18 illustrate a set of exemplary operations that can be carried out to operate a bi-triaxial photoconductive switch module in accordance with an exemplary embodiment. At 1802, a voltage having a first polarity is applied to a first capacitor of the bi-triaxial photoconductive switch module to charge the first capacitor. At 1804, a voltage having a second polarity is applied to a second capacitor of the bi-triaxial photoconductive switch module to charge the second capacitor. The above noted bi-triaxial photoconductive switch module further includes a first photoconductive switch coupled to the first capacitor, a second photoconductive switch coupled to the second capacitor, a center electrode coupled to the first photoconductive switch and to the second photoconductive switch, and an output conductor coupled to the center electrode. At 1806, light is applied to the first photoconductive switch to activate the first photoconductive switch, to cause discharge the first capacitor and to generate an output signal having the first polarity at the output conductor. At 1808, light is applied to the second photoconductive switch that is out of phase with respect to the light applied to the first photoconductive switch to activate the second photoconductive switch, to discharge the second capacitor and to generate an output signal having the second polarity at the output conductor.

By repeating application of the light to the first photoconductive switch, and the light to the second photoconductive switch that is out of phase with respect to the light applied to the first photoconductive switch a plurality of times, a bipolar output waveform is produced. In some exemplary embodiments, the first photoconductive switch is substantially deactivated before the second photoconductive switch is activated and the second photoconductive switch is substantially deactivated before the first photoconductive switch is activated. In one exemplary embodiments, the method that is described in FIG. 18 further includes controlling a pulse shape of the light applied to the first photoconductive switch or the light applied to the second photoconductive switch to control a characteristic of the output bipolar waveform. For example, such a characteristic of the output bipolar waveform can be a direct current (DC) component of the output bipolar waveform.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A bi-triaxial photoconductive switch module, comprising:
    an outer conductor;
    a center electrode;
    a first capacitor formed between a first section of the outer conductor and a first plate that is positioned within a cavity formed by the outer conductor;
    a second capacitor formed between a second section of the outer conductor and a second plate that is positioned within the cavity formed by the outer conductor;
    a first photoconductive switch positioned between the first plate and the center electrode such that, upon activation of the first photoconductive switch, an electrical connection between the first plate and the center electrode is formed;
    a second photoconductive switch positioned between the second plate and the center electrode such that, upon activation of the second photoconductive switch, an electrical connection between the second plate and the center electrode is formed; and
    an output conductor coupled to the center electrode to deliver an output of the bi-triaxial photoconductive switch module.

2. The bi-triaxial photoconductive switch module of claim 1, further comprising one or more light sources coupled to the first and the second photoconductive switches to enable activation of the first and the photoconductive switches.

3. The bi-triaxial photoconductive switch module of claim 2, comprising an optical delay element configured to introduce a timing delay into one or both of: a first light path from the one or more light sources to the first photoconductive switch, or a second light path from the one or more light sources to the second photoconductive switch.

4. The bi-triaxial photoconductive switch module of claim 2, wherein the one or more light sources are configured to deliver light to the first photoconductive switch that is out of phase with respect to light delivered to the second photoconductive switch.

5. The bi-triaxial photoconductive switch module of claim 2, comprising an optical fiber that enables delivery of light to one or both of the first or the second photoconductive switches.

6. The bi-triaxial photoconductive switch module of claim 1, wherein:
    each of the first and the second plates has an elongated rectangular shape,
    the first plate has a first length, a first width and a first thickness, and
    the second plate has a second length, a second width and a second thickness.

7. The bi-triaxial photoconductive switch module of claim 6, wherein the first length is substantially equal to the second length, the first width is substantially equal to the second width and the first thickness is substantially equal to the second thickness.

8. The bi-triaxial photoconductive switch module of claim 6, wherein both the first plate and the second plate are positioned in a parallel configuration with respect to a longitudinal axis of the bi-triaxial photoconductive switch module such that a rectangular area of the first plate having the first length and the first width faces a rectangular area of the second plate having the second length and the second width.

9. The bi-triaxial photoconductive switch module of claim 6, wherein one or both of the first plate or the second plate are positioned at an angled configuration with respect to a longitudinal axis of the bi-triaxial photoconductive switch module such that a rectangular area, or a portion thereof, of the first plate does not face a rectangular area, or a portion thereof, of the second plate.

10. The bi-triaxial photoconductive switch module of claim 9, wherein the angled configuration forms an angle with respect to the longitudinal axis that is substantially equal to 90 degrees.

11. The bi-triaxial photoconductive switch module of claim 9, wherein the outer conductor has an elliptical cross-sectional area.

12. The bi-triaxial photoconductive switch module of claim 1, further comprising one or more power supplies coupled to the first and the second capacitors to supply the first and the second capacitors with voltages having opposite polarities.

13. The bi-triaxial photoconductive switch module of claim 1, wherein the output conductor is a coaxial cable.

14. The bi-triaxial photoconductive switch module of claim 13, comprising a tapered section having a cone-shaped surface that couples the outer conductor to a conductor of the coaxial cable, wherein a diameter of a cylindrical enclosure formed by the outer conductor is larger than a diameter of the conductor of the coaxial cable.

15. The bi-triaxial photoconductive switch module of claim 1, wherein:
    the first capacitor includes a first dielectric material between at least a section of the first plate and a curved surface of the first section of the outer conductor, and
    the second capacitor includes a second dielectric material between at least a section of the second plate and a curved surface of the second section of the outer conductor.

16. The bi-triaxial photoconductive switch module of claim 15, wherein the first dielectric material is the same type as the second dielectric material.

17. The bi-triaxial photoconductive switch module of claim 1, wherein one or both of the first capacitor or the second capacitor is a cast-in-place capacitor.

18. The bi-triaxial photoconductive switch module of claim 16, wherein each of the first and the second capacitor comprises a dielectric material that it formed by pouring or injecting the dielectric material in liquid form into a space between the first section of the outer conductor and the first plate and into a space between the second section of the outer conductor and the second plate, and allowing the liquid to settle into a solid form.

19. The bi-triaxial photoconductive switch module of claim 1, wherein the center electrode comprises a double center-bored electrode that is positioned between the first photoconductive switch and the second photoconductive switch.

20. The bi-triaxial photoconductive switch module of claim 1, wherein the center electrode comprises:
a first hollow electrode,
a second hollow electrode, and a
double center-bored electrode, wherein the first hollow electrode is positioned between the first plate and the first photoconductive switch, the second hollow electrode is positioned between the second plate and the second photoconductive switch, and the double center-bored electrode is positioned between the first photoconductive switch and the second photoconductive switch.

21. The bi-triaxial photoconductive switch module of claim 1, wherein the first capacitor or the second capacitor comprises a discrete capacitor.

22. The bi-triaxial photoconductive switch module of claim 21, wherein the outer conductor has a rectangular cross-sectional area.

23. The bi-triaxial photoconductive switch module of claim 1, wherein the outer conductor has a circular cross-sectional area.

24. A method for operating a bi-triaxial photoconductive switch module, comprising:
supplying a voltage having a first polarity to a first capacitor of the bi-triaxial photoconductive switch module to charge the first capacitor;
supplying a voltage having a second polarity to a second capacitor of the bi-triaxial photoconductive switch module to charge the second capacitor, wherein the bi-triaxial photoconductive switch module further comprises:
a first photoconductive switch coupled to the first capacitor,
a second photoconductive switch coupled to the second capacitor,
a center electrode coupled to the first photoconductive switch and to the second photoconductive switch, and
an output conductor coupled to the center electrode;
applying light to the first photoconductive switch to activate the first photoconductive switch, to discharge the first capacitor and to generate an output signal having the first polarity at the output conductor; and
applying light to the second photoconductive switch that is out of phase with respect to the light applied to the first photoconductive switch to activate the second photoconductive switch, to discharge the second capacitor and to generate an output signal having the second polarity at the output conductor.

25. The method of claim 24, further comprising repeating application of the light to the first photoconductive switch, and the light to the second photoconductive switch that is out of phase with respect to the light applied to the first photoconductive switch a plurality of times to produce a bipolar output waveform.

26. The method of claim 25, wherein the first photoconductive switch is substantially deactivated before the second photoconductive switch is activated and the second photoconductive switch is substantially deactivated before the first photoconductive switch is activated.

27. The method of claim 25, further comprising controlling a pulse shape of the light applied to the first photoconductive switch or the light applied to the second photoconductive switch to control a characteristic of the output bipolar waveform.

28. The method of claim 27, wherein the characteristic of the output bipolar waveform is a direct current (DC) component of the output bipolar waveform.

* * * * *